United States Patent
Okabe et al.

(10) Patent No.: US 10,777,476 B2
(45) Date of Patent: Sep. 15, 2020

(54) SEMICONDUCTOR DEVICE

(71) Applicant: Mitsubishi Electric Corporation, Tokyo (JP)

(72) Inventors: Yuki Okabe, Tokyo (JP); Takanobu Kajihara, Tokyo (JP); Junya Suzuki, Tokyo (JP); Muneaki Mukuda, Tokyo (JP); Hiroyuki Miyanishi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/098,657

(22) PCT Filed: Jun. 9, 2017

(86) PCT No.: PCT/JP2017/021431
§ 371 (c)(1),
(2) Date: Nov. 2, 2018

(87) PCT Pub. No.: WO2017/217328
PCT Pub. Date: Dec. 21, 2017

(65) Prior Publication Data
US 2019/0148251 A1 May 16, 2019

(30) Foreign Application Priority Data
Jun. 14, 2016 (JP) .................................. 2016-117928

(51) Int. Cl.
*H01L 23/31* (2006.01)
*H01L 23/42* (2006.01)
(Continued)

(52) U.S. Cl.
CPC ............ *H01L 23/29* (2013.01); *H01L 21/565* (2013.01); *H01L 23/31* (2013.01);
(Continued)

(58) Field of Classification Search
CPC ... H01L 21/565; H01L 23/3142; H01L 23/36; H01L 23/3736
(Continued)

(56) References Cited

U.S. PATENT DOCUMENTS 5,497,032 A 3/1996 Tsuji et al.
5,698,899 A * 12/1997 Hirakawa ............. H01L 21/565
257/675
(Continued)

FOREIGN PATENT DOCUMENTS

JP 07-231069 A 8/1995
JP 09-153572 A 6/1997
(Continued)

OTHER PUBLICATIONS

International Search Report (PCT/ISA/210) dated Aug. 29, 2017, by the Japan Patent Office as the International Searching Authority for International Application No. PCT/JP2017/021431.
(Continued)

*Primary Examiner* — David Vu
*Assistant Examiner* — Brandon C Fox
(74) *Attorney, Agent, or Firm* — Buchanan Ingersoll & Rooney PC

(57) ABSTRACT

This semiconductor device includes: a first insulation resin portion formed on the mounting surface side of a lead frame; a second insulation resin portion formed on the heat dissipation surface side of the lead frame; and a heatsink fixed to the heat dissipation surface of the second insulation resin portion, wherein the second insulation resin portion has a second skirt portion formed at an end of a thin molded portion, the first insulation resin portion has a first skirt portion covering the second skirt portion, and an outer peripheral surface part of the second skirt portion has a first end connected to the lead frame and the first skirt portion, a
(Continued)

second end connected to the heatsink, and at least one bent portion formed between the first end and the second end.

20 Claims, 39 Drawing Sheets

(51) Int. Cl.
    *H01L 23/29*     (2006.01)
    *H01L 23/373*     (2006.01)
    *H01L 23/433*     (2006.01)
    *H01L 21/56*     (2006.01)
    *H01L 23/36*     (2006.01)
    *H01L 23/00*     (2006.01)

(52) U.S. Cl.
    CPC ...... *H01L 23/3107* (2013.01); *H01L 23/3135* (2013.01); *H01L 23/3142* (2013.01); *H01L 23/36* (2013.01); *H01L 23/3736* (2013.01); *H01L 23/3737* (2013.01); *H01L 23/42* (2013.01); *H01L 23/4334* (2013.01); *H01L 24/39* (2013.01); *H01L 2224/40* (2013.01); *H01L 2224/48091* (2013.01); *H01L 2924/13055* (2013.01); *H01L 2924/13091* (2013.01); *H01L 2924/181* (2013.01)

(58) Field of Classification Search
    USPC .................................................. 257/675, 712
    See application file for complete search history.

(56) References Cited

U.S. PATENT DOCUMENTS

| | | | |
|---|---|---|---|
| 5,804,468 A | 9/1998 | Tsuji et al. | |
| 2003/0057573 A1* | 3/2003 | Sekine | H01L 23/3107 |
| | | | 257/787 |
| 2006/0188727 A1* | 8/2006 | Ito | H01L 23/3733 |
| | | | 428/413 |
| 2010/0295160 A1* | 11/2010 | Liu | H01L 24/49 |
| | | | 257/675 |
| 2011/0147954 A1 | 6/2011 | Kitamura | |
| 2014/0027891 A1* | 1/2014 | Kimura | H01L 21/4825 |
| | | | 257/675 |
| 2014/0353814 A1 | 12/2014 | Sakamoto et al. | |
| 2015/0371921 A1* | 12/2015 | Tanaka | H01L 21/565 |
| | | | 257/712 |
| 2016/0336199 A1* | 11/2016 | Harada | H01L 21/268 |

FOREIGN PATENT DOCUMENTS

| | | |
|---|---|---|
| JP | 11-243166 A | 9/1999 |
| JP | 2008-028006 A | 2/2008 |
| JP | 5415823 B2 | 2/2014 |
| JP | 2016-082129 A | 5/2016 |
| WO | 2010-029726 A1 | 3/2010 |
| WO | 2014-122908 A1 | 8/2014 |

OTHER PUBLICATIONS

Written Opinion (PCT/ISA/237) dated Aug. 29, 2017, by the Japan Patent Office as the International Searching Authority for International Application No. PCT/JP2017/021431.

Extended European Search Report dated May 16, 2019, issued by the European Patent Office in corresponding European Application No. 17813225.4. (9 pages).

Communication pursuant to Article 93(3) EPC dated Apr. 20, 2020, by the European Patent Office in corresponding European Patent Application No. 17813225.4. (9 pages).

* cited by examiner

SEMICONDUCTOR DEVICE

TECHNICAL FIELD

The present invention relates to a semiconductor device of a resin-molded type.

BACKGROUND ART

In a semiconductor device for power or the like, a semiconductor element such as an insulated gate bipolar transistor (IGBT), a metal-oxide-semiconductor field-effect transistor (MOSFET), an integrated circuit (IC) chip, or a large scale integrated circuit (LSI) chip is die-bonded to a lead frame for external terminal, and then electrically connected to a wire by a wire bond process or an inner lead such as a copper plate or a copper alloy by soldering, thereby allowing input and output of signals from and to the outside.

In a semiconductor device of a resin-molded type, a surface (mounting surface) of a lead frame on the side where a semiconductor element is mounted and a heat dissipation surface on the opposite side are sealed by an insulation resin using transfer molding. In particular, as for a semiconductor device for power, a semiconductor element that generates a large amount of heat is provided inside, and therefore an insulation resin for sealing is required to have high thermal conductivity. Accordingly, a semiconductor device is proposed in which, in a molding resin sealing process, the heat dissipation surface side is sealed by a high heat dissipation conductive resin having a thermal conductivity of 3 W/m·K to 10 W/m·K, and the mounting surface side is sealed by a low-stress resin or the like.

Here, molding with two types of resins, i.e., the resin for the mounting surface side and the resin for the heat dissipation surface side forms an interface between the two types of resins. An electric field is likely to concentrate on the interface, and the interface has poor adhesiveness, which causes peeling, leading to a problem that insulation property is deteriorated.

In order to solve the problem, there is technology disclosed in Patent Document 1 below. A semiconductor device of Patent Document 1 includes: a plate-like lead frame having first and second main surfaces and a pattern shape and having an external terminal therearound; a semiconductor element fixed on the first main surface; a heatsink provided so as to be opposed to the second main surface with a gap therebetween; and sealing resin for sealing the semiconductor element, the lead frame, and the heatsink. The sealing resin includes a primary sealing resin and a secondary sealing resin having higher thermal conductivity than the primary sealing resin. The secondary sealing resin has: a part that is in close contact with the second main surface and fills the gap between the lead frame and the heatsink; and a protrusion integrally connected to the above part and penetrating a gap of the lead frame accompanying the pattern shape, to protrude in a wall shape toward the first main surface side. The primary sealing resin is in close contact with the first main surface and encloses the semiconductor element, and also is in close contact with the protrusion.

CITATION LIST

Patent Document

Patent Document 1: Japanese Laid-Open Patent Publication No. 9-153572

SUMMARY OF THE INVENTION

Problems to be Solved by the Invention

In Patent Document 1, the creeping distance between parts of the lead frame that are adjacent to each other via a gap, along the interface between the primary sealing resin and the secondary sealing resin, is increased, whereby insulation performance of the parts of the lead frame is improved, leading to an effect of improving withstand voltage.

However, in Patent Document 1, the creeping distance between the lead frame and the heatsink along the interface between the primary sealing resin and the secondary sealing resin is not taken into consideration.

The present invention has been made to solve the above problems, and an object of the present invention is to provide a semiconductor device that has a longer creeping distance between a lead frame and a heatsink than a conventional one and thus has improved insulation performance.

Solution to the Problems

A semiconductor device according to the present invention includes: a lead frame with a semiconductor element mounted thereto; a first insulation resin portion formed on a mounting surface side of the lead frame on which the semiconductor element is mounted; a second insulation resin portion formed on a heat dissipation surface side of the lead frame which is opposite to the mounting surface side; and a heatsink fixed to a heat dissipation surface of the second insulation resin portion, wherein the second insulation resin portion has a thin molded portion in close contact with the lead frame, and a second skirt portion formed at an end of the thin molded portion, the first insulation resin portion has a first skirt portion protruding toward the heat dissipation surface side of the lead frame and covering the second skirt portion of the second insulation resin portion, and an outer peripheral surface part of the second skirt portion has a first end connected to the lead frame and the first skirt portion, a second end connected to the heatsink, and at least one bent portion formed between the first end and the second end.

Effect of the Invention

The semiconductor device according to the present invention has a longer creeping distance from the lead frame to the heatsink than a conventional one and thus has improved insulation performance.

DESCRIPTION OF EMBODIMENTS

Embodiment 1

Figure 1:
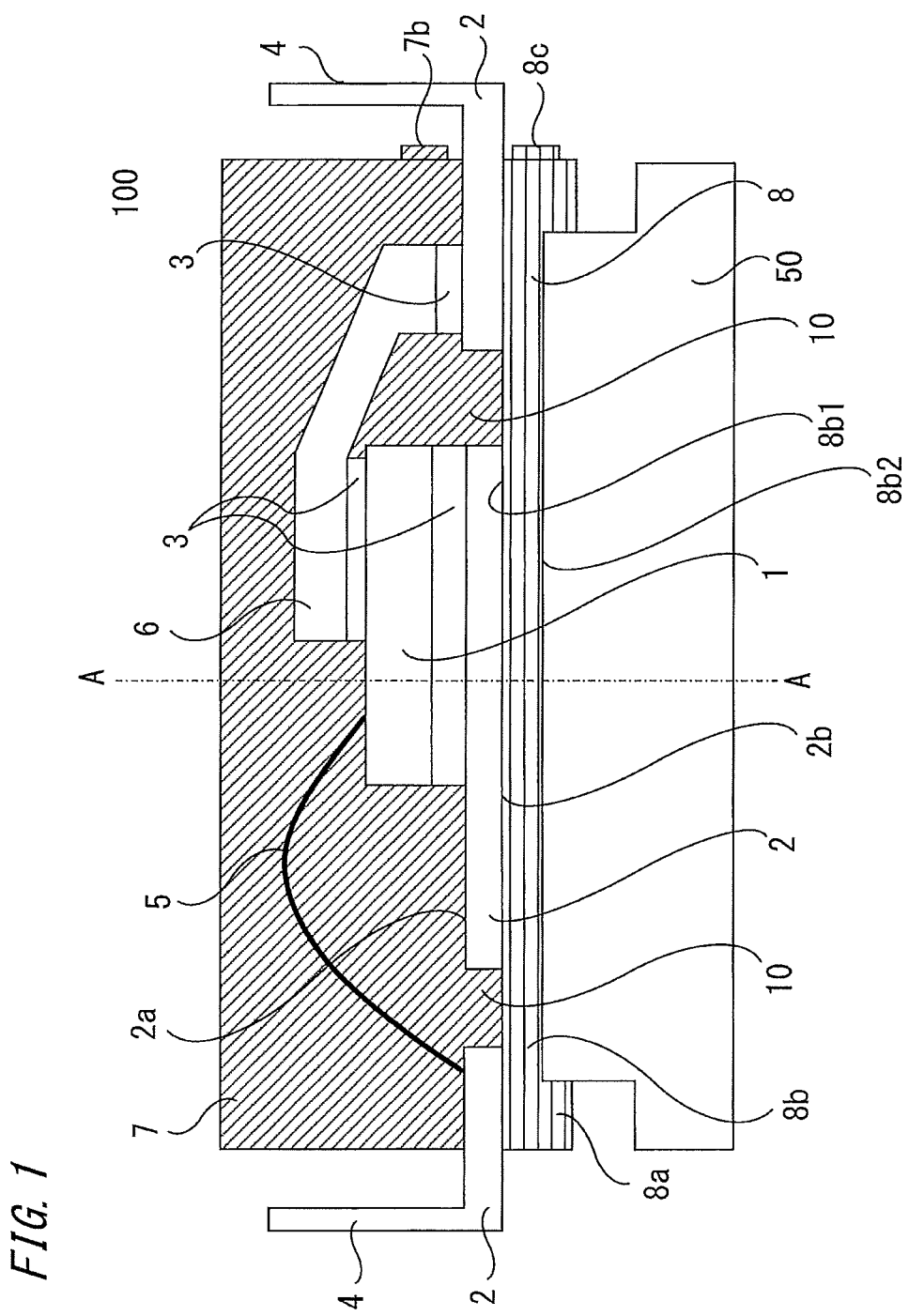
FIG. 1 is a side sectional view showing the configuration of a semiconductor device according to embodiment 1 of the present invention.
Figure 2:
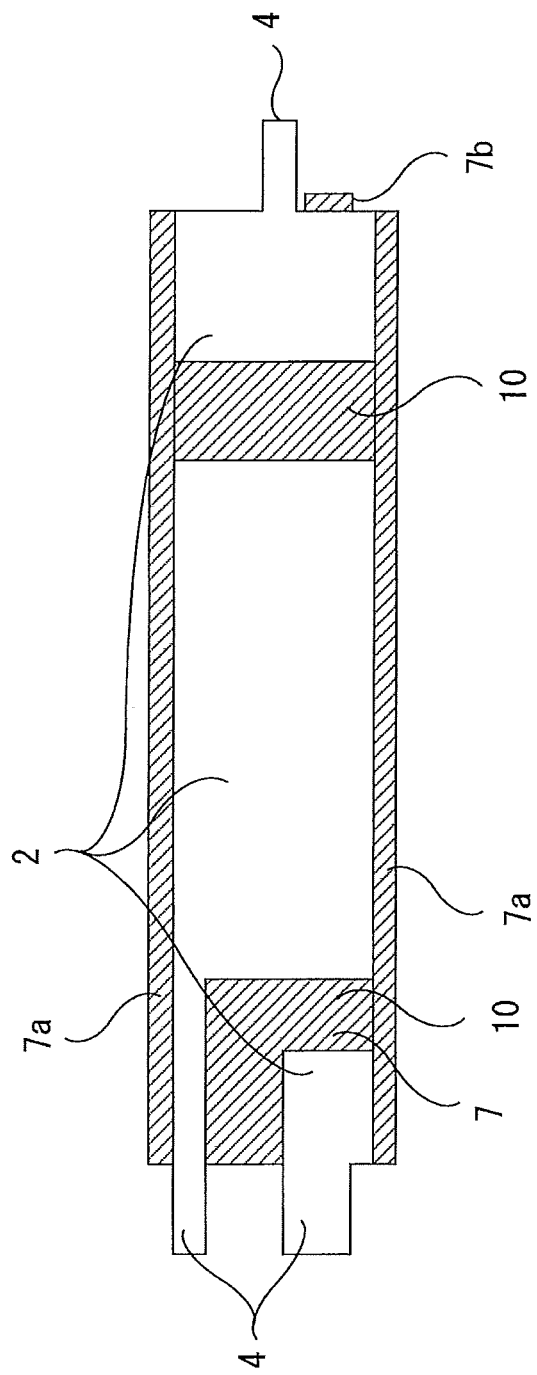
FIG. 2 is a schematic plan view of the semiconductor device after a first-time transfer molding step, as seen from the heat dissipation surface side, in embodiment 1 of the present invention.
Figure 3:
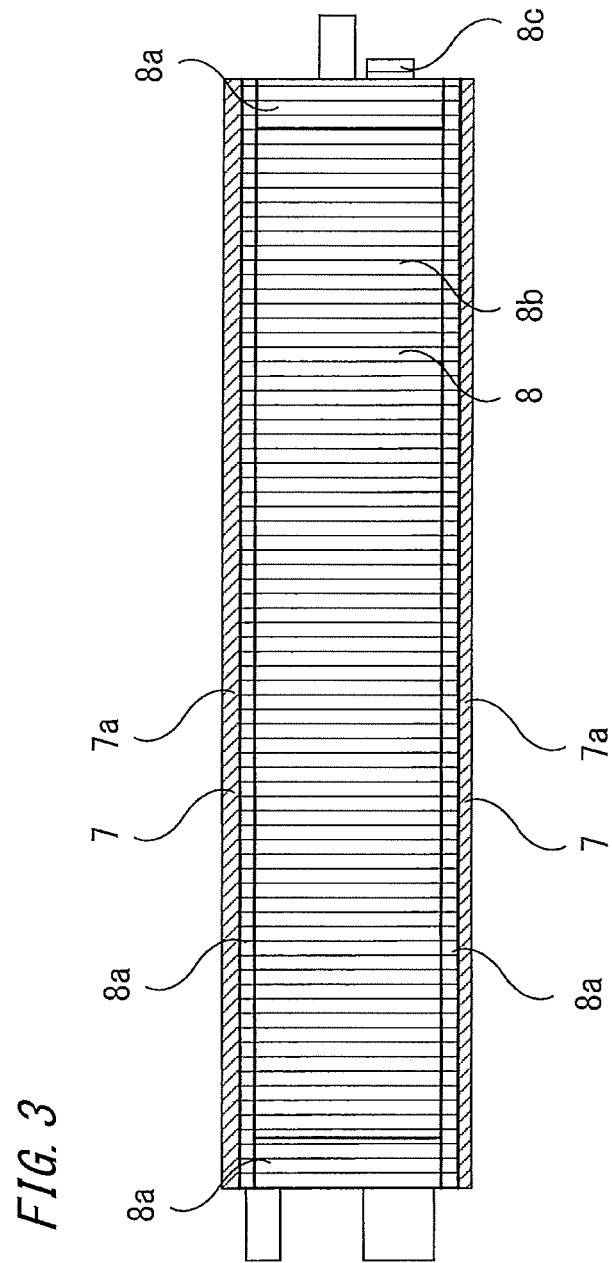
FIG. 3 is a schematic plan view of the semiconductor device after a second-time transfer molding step, as seen from the heat dissipation surface side in embodiment 1 of the present invention.
Figure 4:
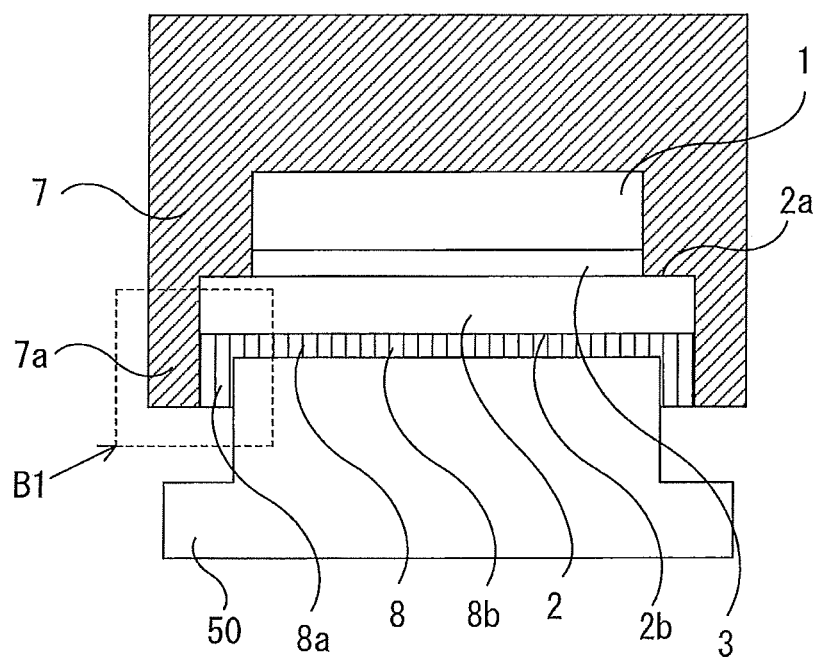
FIG. 4 is a sectional view along A-A line of the semiconductor device shown in FIG. 1.
Figure 5:
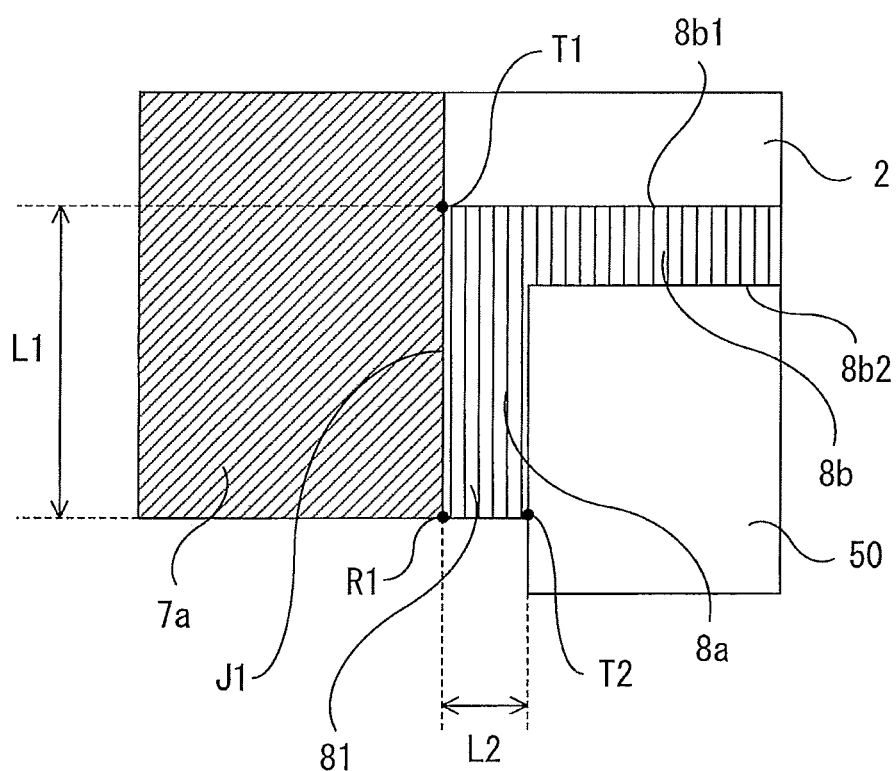
FIG. 5 is an enlarged view of part B1 of the semiconductor device shown in FIG. 4.

Hereinafter, a semiconductor device according to embodiment 1 of the present invention will be described with reference to the drawings. FIG. 1 is a side sectional view showing the configuration of a semiconductor device according to the present embodiment 1, FIG. 2 is a schematic plan view of the semiconductor device in which a first insulation resin portion is formed in a first-time transfer molding step, as seen from the heat dissipation surface side, FIG. 3 is a schematic plan view of the semiconductor device in which a second insulation resin portion is formed in a second-time transfer molding step, as seen from the heat dissipation surface side, FIG. 4 is a sectional view along A-A line of the semiconductor device shown in FIG. 1, and FIG. 5 is an enlarged view of part B1 of the semiconductor device shown in FIG. 4. In FIG. 2 and FIG. 3, a heatsink is not shown. In the drawings, the same or corresponding parts are denoted by the same reference characters.

As shown in the drawings, a semiconductor device 100 according to the present embodiment 1 includes a semiconductor element 1, a lead frame 2, an external terminal 4, a wire 5, an inner lead 6, a first insulation resin portion 7, a second insulation resin portion 8, and a heatsink 50. In FIG. 1, the semiconductor element 1 such as IGBT, MOSFET, IC chip, or LSI chip is mounted above a surface (hereinafter, referred to as mounting surface 2a) of the lead frame 2 that is on the upper side in the drawing, with a joining member 3 such as solder or silver interposed therebetween. The lead frame 2 is made from a copper plate, a copper alloy plate, or the like, and the surface of the lead frame 2 is coated by metallic plating of gold, silver, nickel, tin, or the like (not shown).

An electrode pad of the semiconductor element 1 is electrically connected to the external terminal 4 via the wire 5 connected by wire bonding, or via the inner lead 6 made from a material such as a copper plate or a copper alloy plate, and the semiconductor element 1 performs input and output of signals from and to an external device via the external terminal 4. The wire 5 is made from gold, silver, aluminum, copper, or the like, and the wire diameter thereof is about 20 µm to 500 µm. The inner lead 6 is joined to the semiconductor element 1 or the lead frame 2 via a joining member 3 such as solder or silver. It is noted that the wire 5 and the inner lead 6 are replaceable with each other.

The first insulation resin portion 7 made from a first insulation resin is formed on the mounting surface 2a side of the lead frame 2. The second insulation resin portion 8 made from a second insulation resin is formed on the heat dissipation surface 2b side of the lead frame 2 which is opposite to the mounting surface 2a. A part 10 (hereinafter, referred to as die pad interval part 10) between two separate areas of the lead frame 2 is filled with the first insulation resin, to form the first insulation resin portion 7.

The second insulation resin portion 8 has a thin molded portion 8b formed in contact with the heat dissipation surface 2b of the lead frame 2. The thickness of the thin molded portion 8b is about 0.02 mm to 0.3 mm. The heatsink 50 made of copper, aluminum, or the like is joined, via a heat dissipation member such as grease or by resin molding, to a heat dissipation surface 8b2 of the thin molded portion 8b which is opposite to a lead frame joining surface 8b1 in contact with the lead frame 2.

The insulation resins forming the first insulation resin portion 7 and the second insulation resin portion 8 are both thermosetting epoxy resin or the like. It is noted that the second insulation resin portion 8 formed on the heat dissipation surface 2b side of the lead frame 2 is made of an insulation resin having higher thermal conductivity than the first insulation resin portion 7 formed on the mounting surface 2a side. The second insulation resin forming the second insulation resin portion 8 contains a filler such as silica, alumina, boron nitride, or aluminum nitride having high thermal conductivity, and the thermal conductivity of the second insulation resin portion 8 is 3 W/m·K to 12 W/m·K. For the first insulation resin portion 7 on the mounting surface 2a side, a low-stress insulation resin having great fluidity, which is used for a general semiconductor device, is used. For example, a low-stress insulation resin obtained by adding silicone to a thermosetting epoxy resin or the like, or a low-stress insulation resin having a thermal expansion coefficient close to that of the lead frame, is used.

As shown in FIG. 4 and FIG. 5, at the outer peripheral end part on the heat dissipation surface 2b side of the lead frame 2, a first skirt portion 7a formed from the first insulation resin and a second skirt portion 8a formed from the second insulation resin are provided. That is, the second insulation resin portion 8 has the thin molded portion 8b having a thickness of about 0.02 mm to 0.3 mm and formed in close contact with the heat dissipation surface 2b of the lead frame 2, and the second skirt portion 8a having a first protrusion 81 protruding from an end of the thin molded portion 8b toward the heat dissipation surface 8b2 side of the second insulation resin portion 8. The first insulation resin portion 7 has the first skirt portion 7a protruding toward the heat dissipation surface 2b side of the lead frame 2 and covering the second skirt portion 8a.

The first skirt portion 7a and the second skirt portion 8a have protrusion shapes such that the virtual-direction thicknesses thereof from the heat dissipation surface 2b of the lead frame 2 are about 0.3 mm to 2 mm which is thicker than the thickness of the thin molded portion 8b.

As shown in FIG. 5, the second skirt portion 8a has, at an outer peripheral surface part thereof: a first end T1 connected to the lead frame 2 and the first skirt portion 7a; a second end T2 connected to the heatsink 50; and at least one bent portion formed between the first end T1 and the second end T2, i.e., a first bent portion R1 formed at the first protrusion 81. Part from the first end T1 to the first bent portion R1 forms a first joining portion J1 between the first skirt portion 7a and the second skirt portion 8a.

In FIG. 5, part from the first end T1 to the first bent portion R1 is shown in a straight shape, and part from the first bent portion R1 to the second end T2 is shown in a straight shape. These parts shown in straight shapes have flat plane shapes. However, in actuality, the first skirt portion 7a and the second skirt portion 8a are molded with resin by transfer molding, and thus these plane shapes have irregularity to a certain degree. In addition, in the drawings for other examples of the present invention shown below, part between the first end and the bent portion, part between the bent portions, and part between the bent portion and the second end, which are shown in straight shapes, have flat plane shapes as in the above case.

In FIG. 5, the first bent portion R1 is shown in a rectangular shape. However, in actuality, the second skirt portion 8a is molded with resin by transfer molding and thus has a curved part or irregularity to a certain degree.

Next, the creeping distance from the lead frame 2 to the heatsink 50 in the semiconductor device 100 of the present embodiment 1 will be described.

Figure 6:
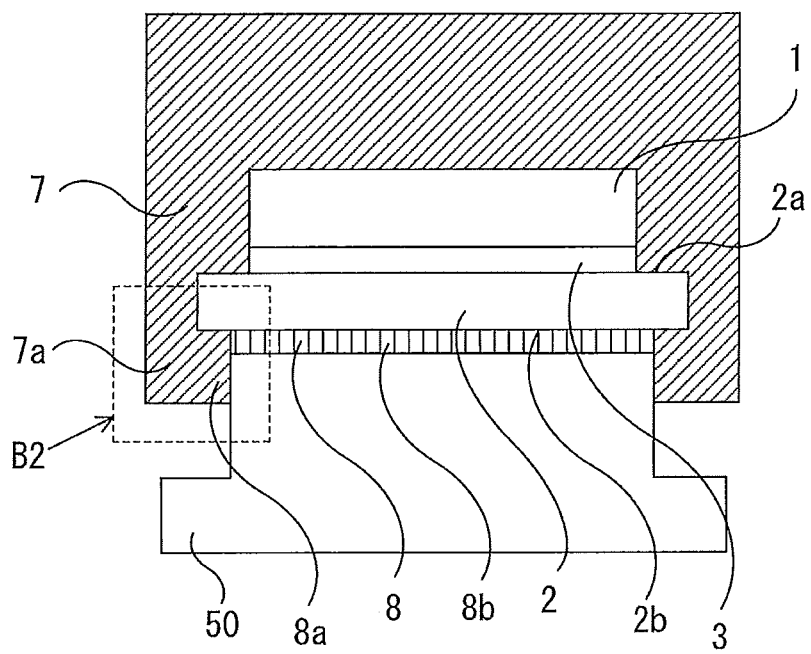
FIG. 6 is a view of a semiconductor device in a comparative example of embodiment 1 and corresponds to FIG. 4.
Figure 7:
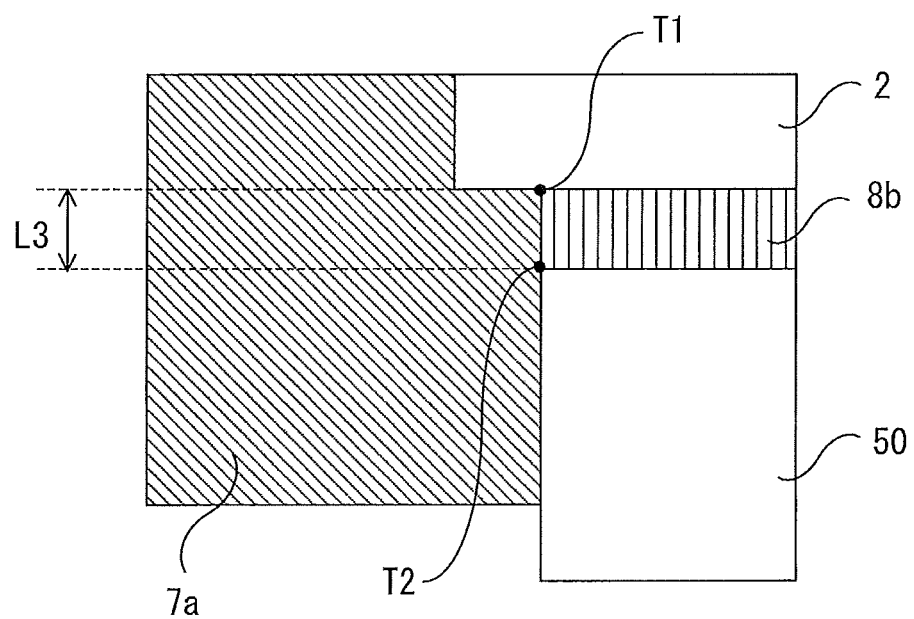
FIG. 7 is an enlarged view of part C of the semiconductor device shown in FIG. 6.

FIG. 6 is a sectional view of a semiconductor device in a comparative example of the present embodiment, along A-A line in FIG. 1, and corresponds to FIG. 4. FIG. 7 is an enlarged view of part B2 of the semiconductor device shown in FIG. 6.

The semiconductor device in the comparative example shown in FIG. 6 and FIG. 7 does not have the second skirt portion 8a protruding from an end of the thin molded portion 8b toward the heat dissipation surface side as in the present embodiment, and a creeping distance L from the lead frame 2 to the heatsink 50 is a distance L3 from the first end T1 connected to the lead frame 2, the first skirt portion 7a, and the thin molded portion 8b, to the second end T2 connected to the heatsink 50, the first skirt portion 7a, and the thin molded portion 8b.

On the other hand, in the semiconductor device of the present embodiment, as shown in FIG. 5, a creeping distance L from the lead frame 2 to the heatsink 50 is the sum (L=L1+L2) of a distance L1 from the first end T1 connected to the lead frame 2, the first skirt portion 7a, and the second skirt portion (first protrusion) 8a, to the first bent portion R1 formed at the second skirt portion 8a (first protrusion 81), and a distance L2 from the first bent portion R1 to the second end T2 connected to the heatsink 50 and the second skirt portion (first protrusion) 8a. It is noted that part from the first end T1 to the first bent portion R1 is the first joining portion J1 which is the interface between the first skirt portion 7a and the second skirt portion 8a.

As described above, in the semiconductor device of the present embodiment, the creeping distance from the lead frame 2 to the heatsink 50 is greatly increased and insulation property is improved, as compared to the semiconductor device in the comparative example shown in FIG. 6 and FIG. 7.

Figure 9:
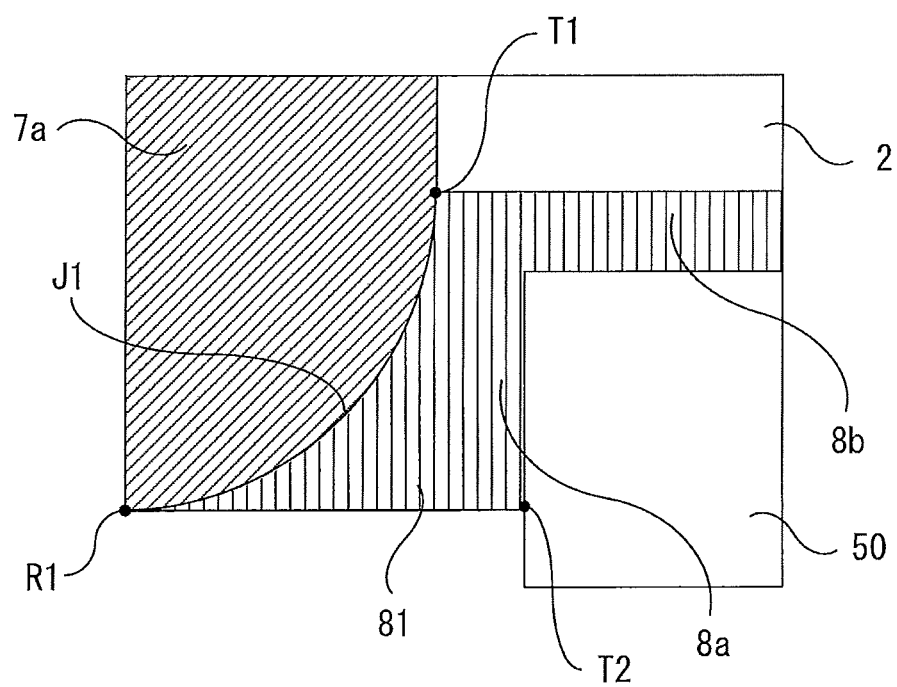
FIG. 9 is an enlarged view of a part of a semiconductor device in modification 2 of embodiment 1.

Also in comparison with the semiconductor device shown in FIG. 9 of Patent Document 1 described above, the creeping distance from the lead frame to the heatsink in the semiconductor device of the present embodiment is increased and thus insulation property is improved. That is, in FIG. 9 of Patent Document 1, the creeping distance from the lead frame to the heatsink extends in a straight line via the interface of the primary sealing resin and the secondary sealing resin, whereas the creeping distance in the present embodiment extends from the first end T1 of the lead frame 2 via the first bent portion R1 to the second end T2 of the heatsink 50. Therefore, the creeping distance is increased and insulation property is also improved.

Modification of Embodiment 1

Modification 1

Figure 8:
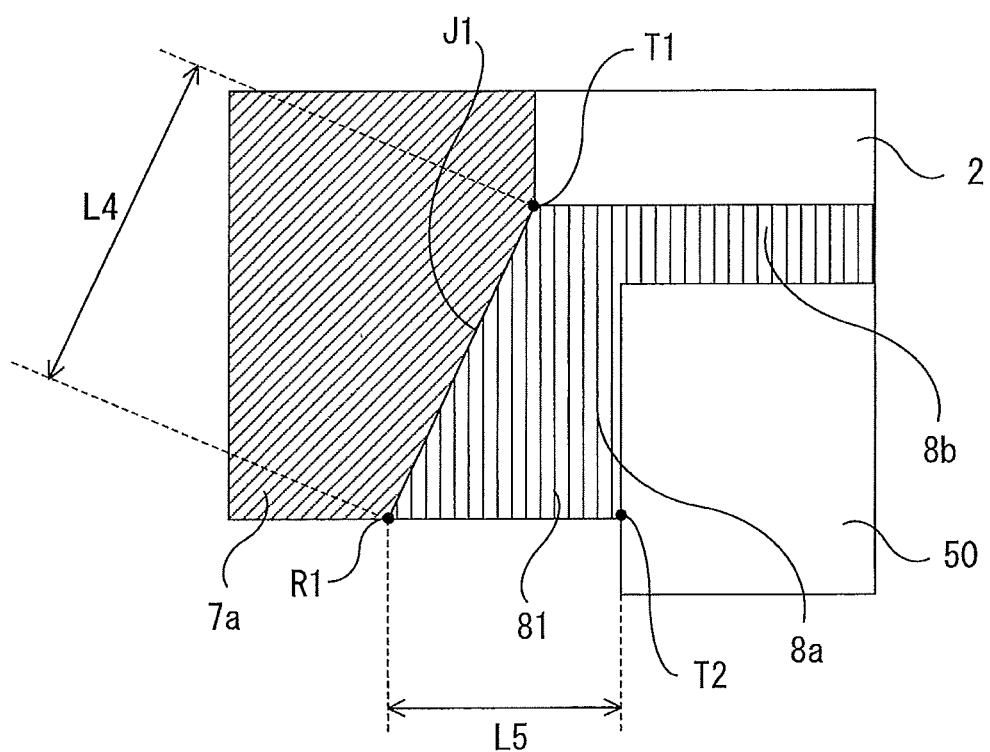
FIG. 8 is an enlarged view of a part of a semiconductor device in modification 1 of embodiment 1.

In the sectional view of the semiconductor device shown in FIG. 4 and FIG. 5, the outer peripheral surface part of the second skirt portion 8a is formed in a straight line extending from the first end T1 toward the heat dissipation side to reach the first bent portion R1. However, as shown in FIG. 8, the outer peripheral surface part of the second skirt portion 8a may be sloped outward from the first end T1 to the first bent portion R1. In this case, the second skirt portion 8a has a trapezoidal shape, and the creeping distance from the lead frame 2 to the heatsink 50 is the sum (L4+L5) of a distance L4 from the first end T1 to the first bent portion R1 and a distance L5 from the first bent portion R1 to the second end T2, and thus is longer than the creeping distance (L1+L2) in the semiconductor device shown in FIG. 4 and FIG. 5.

Modification 2

As shown in FIG. 9, the outer peripheral surface part of the second skirt portion 8a may be formed in an arc shape expanding outward from the first end T1 to the first bent portion R1. Also in this case, the creeping distance from the lead frame 2 to the heatsink 50 is the sum of the distance from the first end T1 to the first bent portion R1 and the distance from the first bent portion R1 to the second end T2, and thus is longer than the creeping distance (L1+L2) in the semiconductor device shown in FIG. 4 and FIG. 5.

Modification 3

Figure 10:
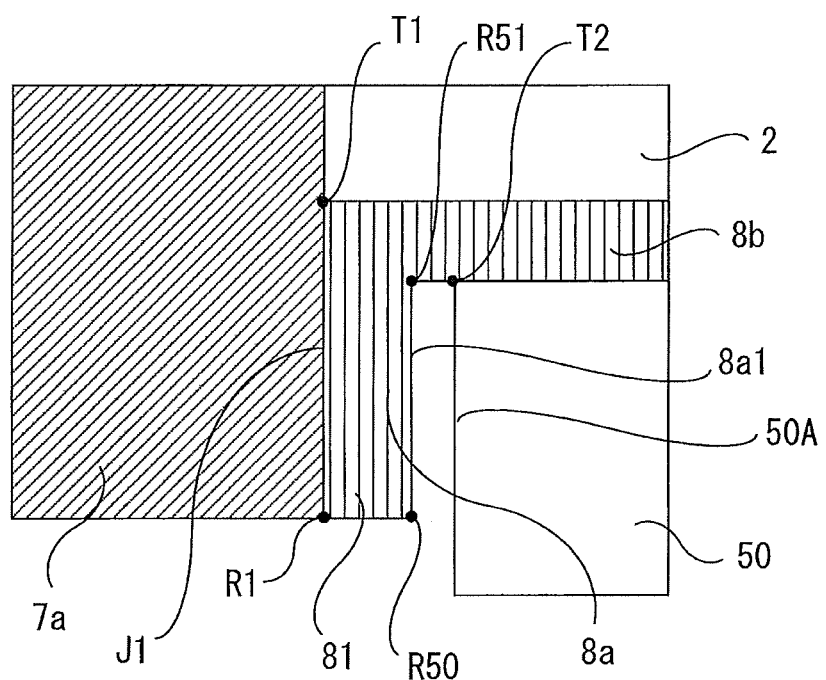
FIG. 10 is an enlarged view of a part of a semiconductor device in modification 3 of embodiment 1.

As shown in FIG. 10, a side surface portion 50A of the heatsink 50 may be separated from one side surface portion 8a1 of the second skirt portion 8a. In such a configuration, the creeping distance from the lead frame 2 to the heatsink 50 is the sum of the distance from the first end T1 to the first bent portion R1, the distance from the first bent portion R1 to a bent portion R50, the distance from the bent portion R50 to a bent portion R51, and the distance from the bent portion R51 to the second end T2, and thus is longer than the creeping distance (L1+L2) in the semiconductor device shown in FIG. 4 and FIG. 5.

Modification 4

Figure 11:
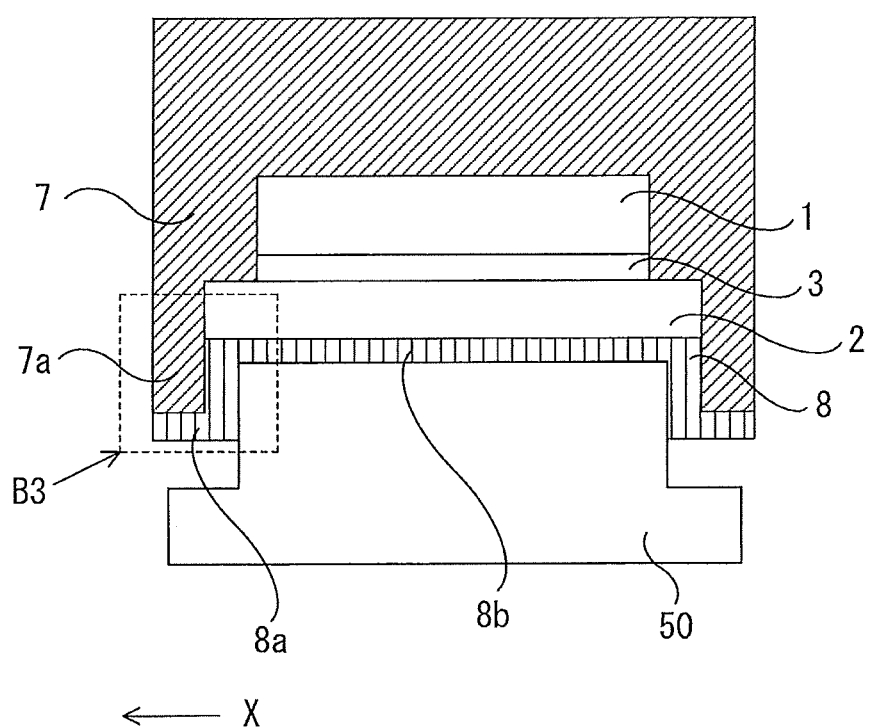
FIG. 11 is a sectional view of a semiconductor device in modification 4 of embodiment 1, along A-A line in FIG. 1.
Figure 12:
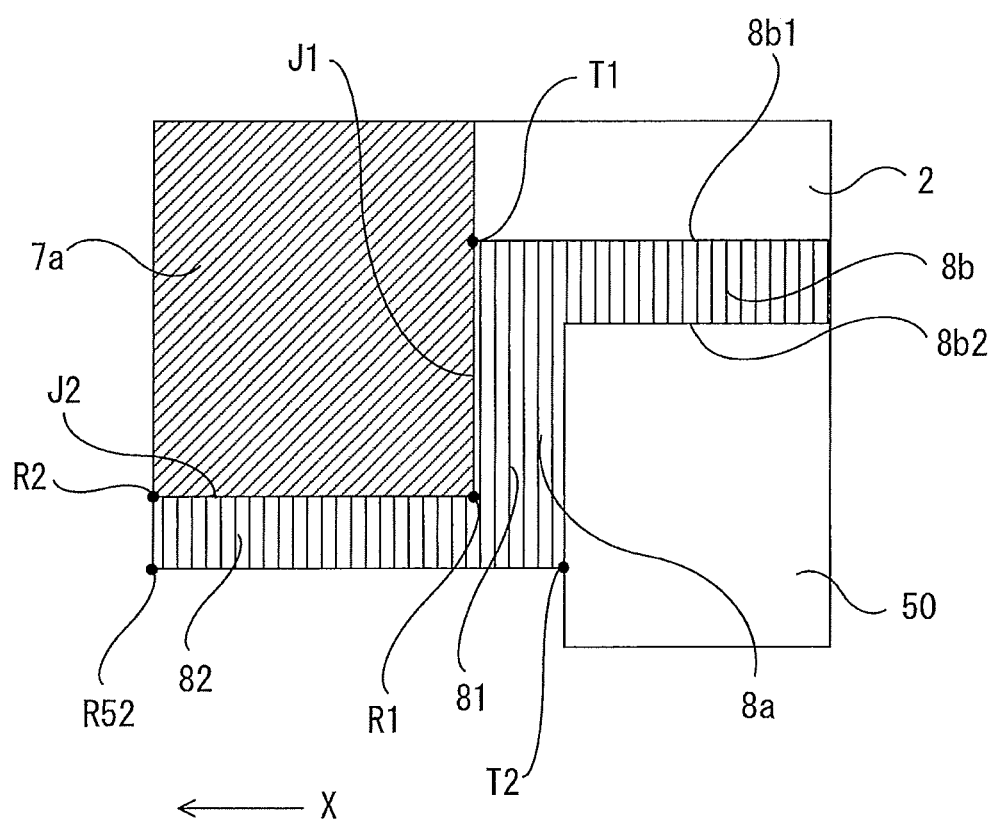
FIG. 12 is an enlarged view of part B3 of the semiconductor device shown in FIG. 11.

FIG. 11 is a sectional view of a semiconductor device in modification 4 of the present embodiment, along A-A line in FIG. 1, and corresponds to FIG. 4. FIG. 12 is an enlarged view of part B3 of the semiconductor device shown in FIG. 11.

In FIG. 11 and FIG. 12, the second skirt portion 8a has the first protrusion 81 protruding toward the heat dissipation surface 8b2 side of the thin molded portion 8b, and a second protrusion 82 protruding from the first protrusion 81 toward the side surface (X direction in the drawing) of the semiconductor device 100, and further has the first bent portion R1 formed at the first protrusion 81 and a second bent portion R2 formed at the second protrusion 82. Part from the first end T1 to the first bent portion R1 is the first joining portion J1 between the first skirt portion 7a and the second skirt portion 8a, and part from the first bent portion R1 to the second bent portion R2 is a second joining portion J2 between the first skirt portion 7a and the second skirt portion 8a. That is, the second skirt portion 8a is formed so as to cover the inner side surface and a surface that is on the lower side in the drawing, of the first skirt portion 7a.

In such a configuration, the creeping distance from the lead frame 2 to the heatsink 50 is the sum of the distance from the first end T1 to the first bent portion R1, the distance from the first bent portion R1 to the second bent portion R2, the distance from the second bent portion R2 to a bent portion R52, and the distance from the bent portion R52 to the second end T2, and thus is longer than the creeping distance (L1+L2) in the semiconductor device shown in FIG. 4 and FIG. 5.

Figure 13:
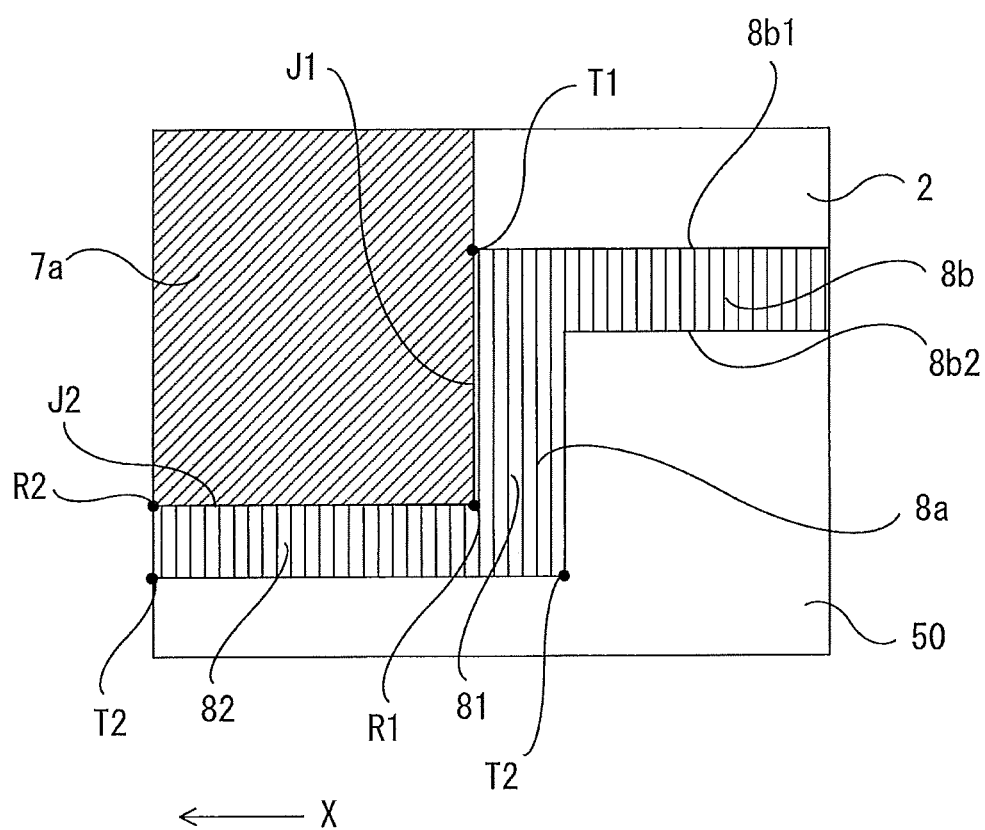
FIG. 13 is an enlarged view of a part of the semiconductor device in modification 4 of embodiment 1.

As shown in FIG. 13, the heatsink 50 may be joined to the heat dissipation surface side of the second protrusion 82 of the second skirt portion 8a. Also in this case, the creeping distance from the lead frame 2 to the heatsink 50 is the sum of the distance from the first end T1 to the first bent portion R1, the distance from the first bent portion R1 to the second bent portion R2, and the distance from the second bent portion R2 to the second end T2, and thus is longer than the creeping distance (L1+L2) in the semiconductor device shown in FIG. 4 and FIG. 5.

Modification 5

Figure 14:
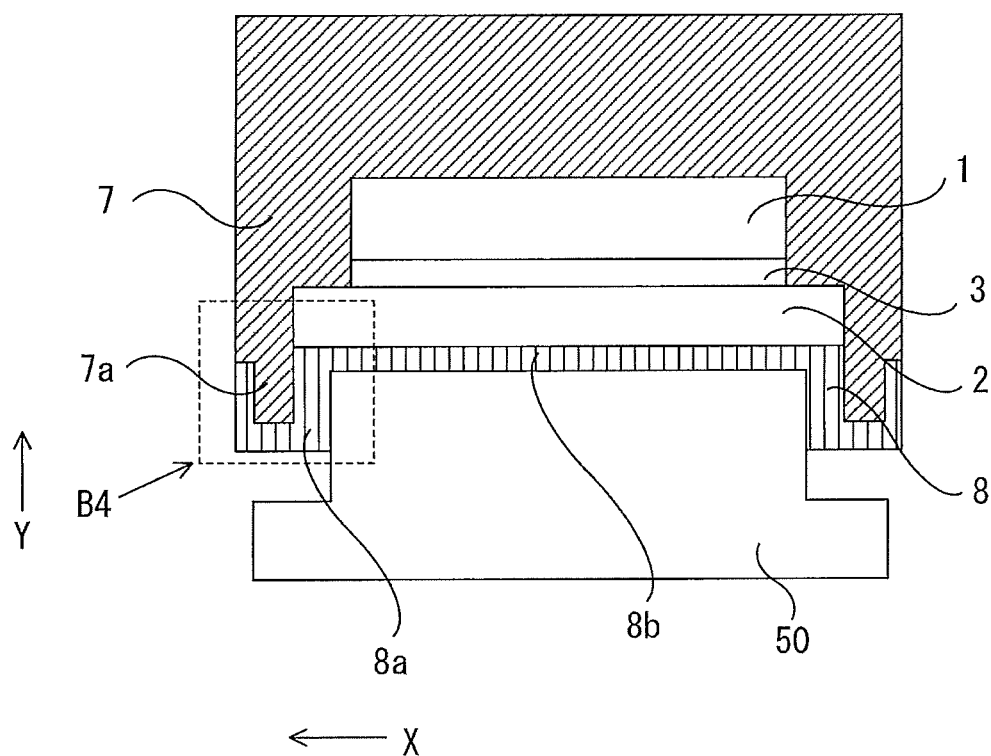
FIG. 14 is a sectional view of a semiconductor device in modification 5 of embodiment 1, along A-A line in FIG. 1.
Figure 15:
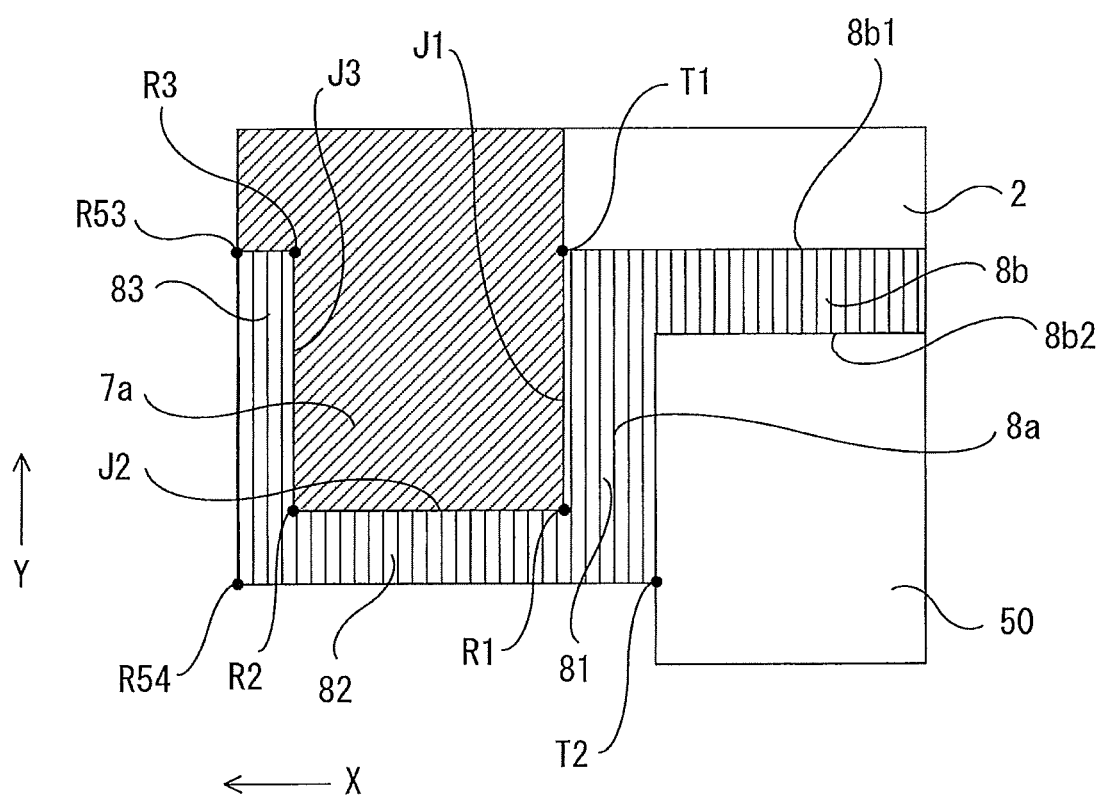
FIG. 15 is an enlarged view of part B4 of the semiconductor device shown in FIG. 14.

FIG. 14 is a sectional view of a semiconductor device in modification 5 of the present embodiment, along A-A line in FIG. 1, and corresponds to FIG. 4. FIG. 15 is an enlarged view of part B4 of the semiconductor device shown in FIG. 14.

In FIG. 14 and FIG. 15, the second skirt portion 8a has the first protrusion 81 protruding toward the heat dissipation surface 8b2 side of the thin molded portion 8b, the second protrusion 82 protruding from the first protrusion 81 toward the side surface (X direction in the drawing) of the semiconductor device 100, and a third protrusion 83 protruding toward the mounting surface side of the lead frame 2 from the second protrusion 82, and further has the first bent portion R1 formed at the first protrusion 81, the second bent portion R2 formed at the second protrusion 82, and a third bent portion R3 formed at the third protrusion 83. Part from the first end T1 to the first bent portion R1 is the first joining portion J1 between the first skirt portion 7a and the second skirt portion 8a, part from the first bent portion R1 to the second bent portion R2 is the second joining portion J2 between the first skirt portion 7a and the second skirt portion 8a, and part from the second bent portion R2 to the third bent portion R3 is a third joining portion J3 between the first skirt portion 7a and the second skirt portion 8a. That is, the second skirt portion 8a is formed so as to cover the inner side surface, the outer side surface, and a surface that is on the lower side in the drawing, of the first skirt portion 7a.

In such a configuration, the creeping distance from the lead frame 2 to the heatsink 50 is the sum of the distance from the first end T1 to the first bent portion R1, the distance from the first bent portion R1 to the second bent portion R2, the distance from the second bent portion R2 to the third bent portion R3, the distance from the third bent portion R3 to a bent portion R53, the distance from the bent portion R53 to a bent portion R54, and the distance from the bent portion R54 to the second end T2, and thus is longer than the creeping distance (L1+L2) in the semiconductor device shown in FIG. 4 and FIG. 5.

Figure 16:
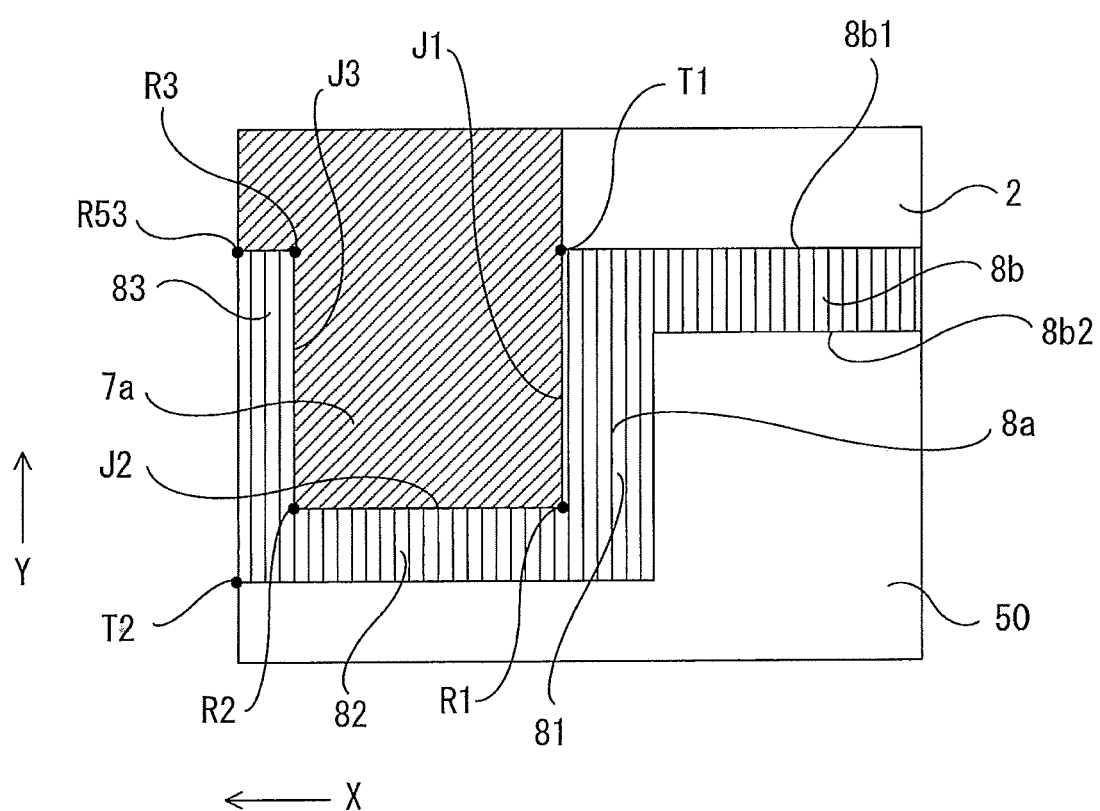
FIG. 16 is an enlarged view of a part of the semiconductor device in modification 5 of embodiment 1.

As shown in FIG. 16, the heatsink 50 may be joined to the heat dissipation surface side of the second protrusion 82 of the second skirt portion 8a. Also in this case, the creeping distance from the lead frame 2 to the heatsink 50 is the sum of the distance from the first end T1 to the first bent portion R1, the distance from the first bent portion R1 to the second bent portion R2, the distance from the second bent portion R2 to the third bent portion R3, the distance from the third bent portion R3 to the bent portion R53, and the distance from the bent portion R53 to the second end T2, and thus is longer than the creeping distance (L1+L2) in the semiconductor device shown in FIG. 4 and FIG. 5.

As described above, in the present embodiment, the semiconductor device includes: a lead frame with a semiconductor element mounted thereto; a first insulation resin portion formed on the mounting surface side of the lead frame on which the semiconductor element is mounted; a second insulation resin portion formed on the heat dissipation surface side of the lead frame which is opposite to the mounting surface side; and a heatsink fixed to the heat dissipation surface side of the second insulation resin portion. The second insulation resin portion has a thin molded portion in close contact with the lead frame, and a second skirt portion formed at an end of the thin molded portion. The first insulation resin portion has a first skirt portion protruding toward the heat dissipation surface side of the lead frame and covering the second skirt portion of the second insulation resin portion. The outer peripheral surface part of the second skirt portion has a first end connected to the lead frame and the first skirt portion, a second end connected to the heatsink, and at least one bent portion formed between the first end and the second end. Therefore, the creeping distance from the lead frame to the heatsink is increased as compared to a conventional one, whereby insulation performance is improved.

In addition, the protrusion-direction thicknesses of the first skirt portion and the second skirt portion are greater than the thickness of the thin molded portion. Therefore, it is possible to increase the creeping distance between the lead frame and the heatsink by a necessary insulation distance, and prevent decrease in heat dissipation.

In addition, since the first skirt portion and the second skirt portion are provided, the strength and the insulation distance at an outer peripheral end part of the lead frame to which voltage is applied can be ensured.

In the present embodiment, the case where the surface of the lead frame is coated by metallic plating of gold, silver, nickel, tin, or the like has been described. However, the surface of the lead frame may not be coated. In the present embodiment, the lead frame has a uniform thickness. However, the lead frame may have a different thickness at some part thereof. In the present embodiment, the case of joining the heatsink to the thin molded portion via a heat dissipation member such as grease has been described. However, a heat dissipation member may not be used.

In the present embodiment, the mounting surface side of the lead frame may also have the same heat dissipation property as the heat dissipation surface side. For example, a high heat dissipation resin having a thermal conductivity of 3 W/m·K to 12 W/m·K, which is the same as the second insulation resin portion, may be used as the first insulation resin portion. Since the periphery of the semiconductor element which is a heat generating component is sealed by the high heat dissipation resin, heat is dissipated from the entire periphery of the semiconductor element and thus heat dissipation is increased.

In the present embodiment, as shown in FIG. 3, in the semiconductor device having substantially a rectangular shape in a plan view, the first skirt portion formed from the first insulation resin is located on the long side and the second skirt portion formed from the second insulation resin is located on the short side. However, this configuration may be reversed depending on the position of the gate of a molding die to be used.

In the present embodiment, in the semiconductor device having substantially a rectangular shape in a plan view, the positions of the sides formed by the first skirt portion molded with the first insulation resin and the second skirt portion molded with the second insulation resin are not limited to those shown in FIG. 3, and also, the number of the sides of each of the first skirt portion and the second skirt portion is not limited to two.

In the present embodiment, the position of a gate break left part 7b occurring after the first insulation resin portion is molded or the position of a gate break left part 8c occurring after the second insulation resin portion is molded, is not limited to that shown in FIG. 1 and FIG. 3, and also, the number thereof is not limited to one but may be plural.

In the present embodiment, as shown in FIG. 2 and FIG. 3, after the first insulation resin portion is molded in the first-time transfer molding step, the second insulation resin portion is molded in the second-time transfer molding step. However, after the second insulation resin portion is molded in the first-time transfer molding step, the first insulation resin portion may be molded in the second-time transfer molding step.

Embodiment 2

Hereinafter, a semiconductor device according to embodiment 2 of the present invention will be described with reference to the drawings.

The entire configuration of the semiconductor device in the present embodiment is the same as that of the semiconductor device according to embodiment 1, and therefore mainly, only differences will be described. In the drawings, parts that are the same as or correspond to those in embodiment 1 are denoted by the same reference characters.

Figure 17:
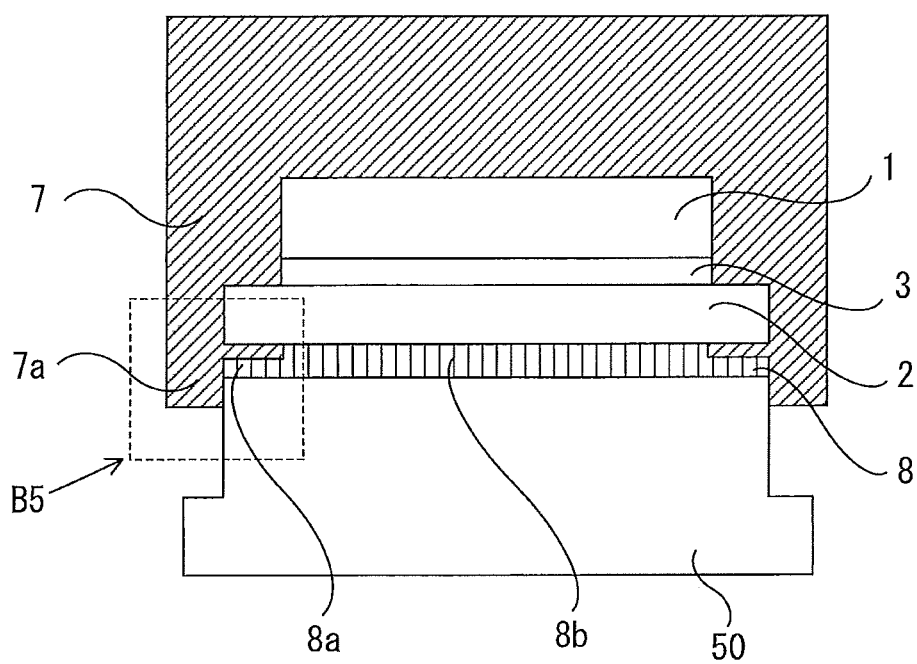
FIG. 17 is a sectional view of a semiconductor device in embodiment 2 of the present invention, along A-A line in FIG. 1.
Figure 18:
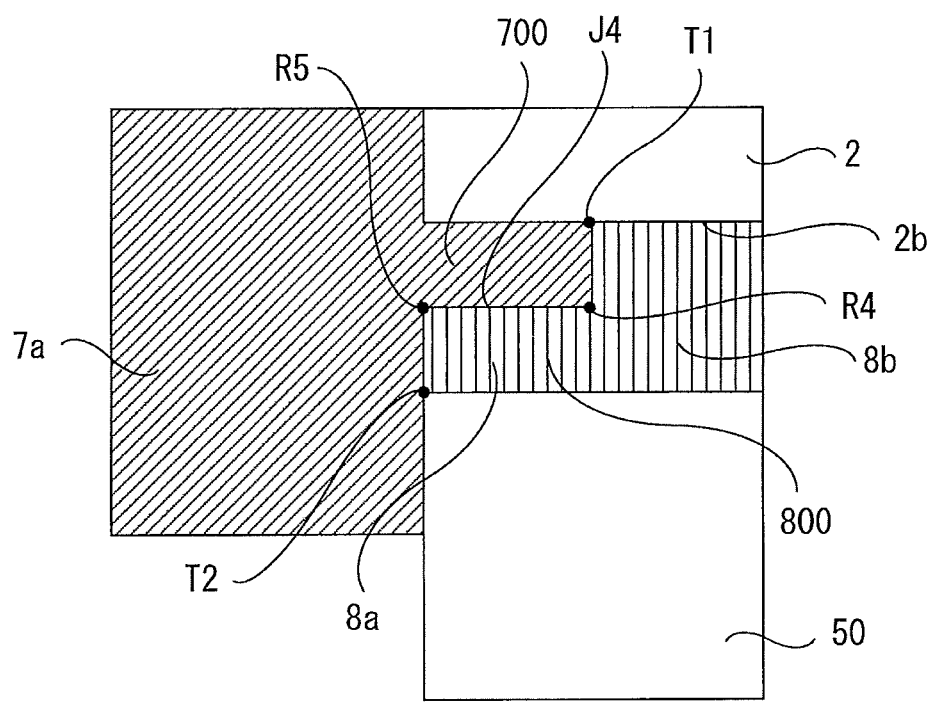
FIG. 18 is an enlarged view of part B5 of the semiconductor device shown in FIG. 17.

FIG. 17 is a sectional view of the semiconductor device in the present embodiment 2, along A-A line in FIG. 1, and corresponds to FIG. 4. FIG. 18 is an enlarged view of part B5 of the semiconductor device shown in FIG. 17.

In the present embodiment, as shown in FIG. 17 and FIG. 18, the second skirt portion 8a has a step portion 800 extending in parallel with the lead frame 2 from an end of the thin molded portion 8b, and the first skirt portion 7a has a first wraparound portion 700 formed between the step portion 800 and the heat dissipation surface 2b of the lead frame 2. A fourth bent portion R4 and a fifth bent portion R5 are formed along a fourth joining portion J4 between the step portion 800 of the second skirt portion 8a and the first wraparound portion 700 of the first skirt portion 7a.

In the present embodiment, the creeping distance from the lead frame 2 to the heatsink 50 is the sum of the distance from the first end T1 to the fourth bent portion R4, the distance from the fourth bent portion R4 to the fifth bent portion R5, and the distance from the fifth bent portion R5 to the second end T2, and thus is longer than the creeping distance (L1) in the semiconductor device shown in FIG. 6 and FIG. 7. Therefore, insulation performance is improved.

Modification of Embodiment 2

Modification 1

Figure 19:
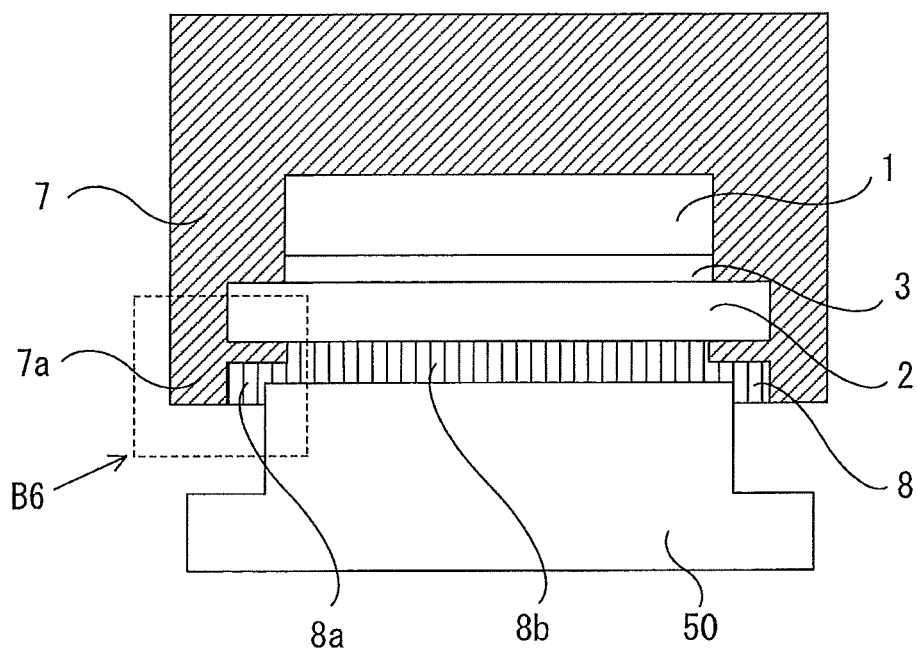
FIG. 19 is a sectional view of a semiconductor device in modification 1 of embodiment 2, along A-A line in FIG. 1.
Figure 20:
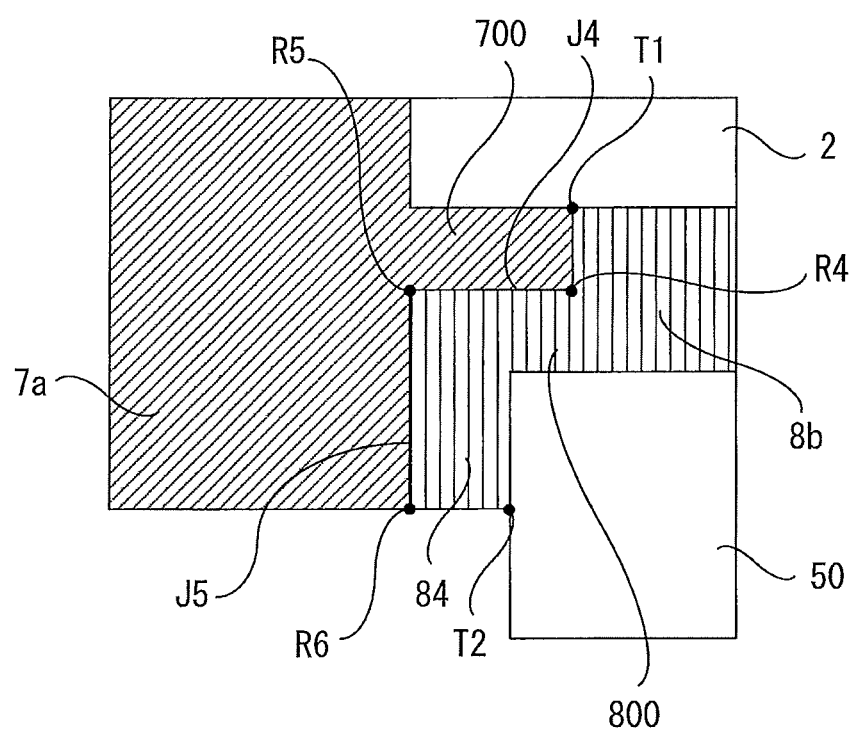
FIG. 20 is an enlarged view of part B6 of the semiconductor device shown in FIG. 19.

FIG. 19 is a sectional view of a semiconductor device in modification 1 of embodiment 2, along A-A line in FIG. 1, and corresponds to FIG. 4. FIG. 20 is an enlarged view of part B6 of the semiconductor device shown in FIG. 19.

In FIG. 19 and FIG. 20, the second skirt portion 8a has a fourth protrusion 84 protruding from the step portion 800 toward the heat dissipation surface side of the thin molded portion 8b, and a sixth bent portion R6 is formed at the fourth protrusion 84. Part from the fifth bent portion R5 to the sixth bent portion R6 is a fifth joining portion J5 between the first skirt portion 7a and the second skirt portion 8a.

In such a configuration, the creeping distance from the lead frame 2 to the heatsink 50 is the sum of the distance from the first end T1 to the fourth bent portion R4, the distance from the fourth bent portion R4 to the fifth bent portion R5, the distance from the fifth bent portion R5 to the sixth bent portion R6, and the distance from the sixth bent portion R6 to the second end T2, and thus is longer than the creeping distance L1 in the semiconductor device shown in FIG. 6 and FIG. 7.

Figure 21:
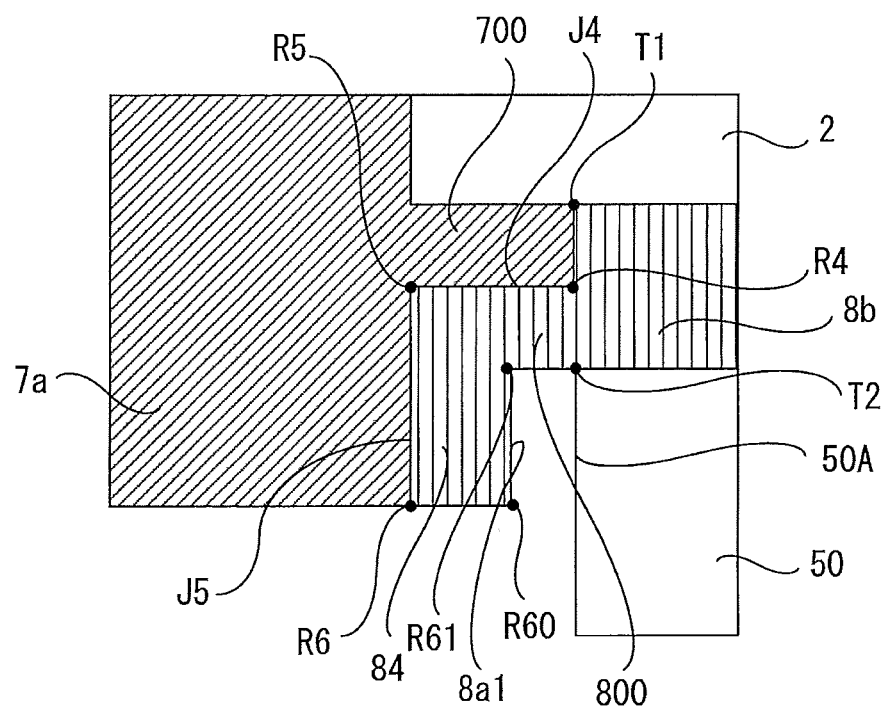
FIG. 21 is an enlarged view of a part of the semiconductor device in modification 1 of embodiment 2.

As shown in FIG. 21, the side surface portion 50A of the heatsink 50 may be separated from one side surface portion 8a1 of the second skirt portion 8a. In such a configuration, the creeping distance from the lead frame 2 to the heatsink 50 is the sum of the distance from the first end T1 to the fourth bent portion R4, the distance from the fourth bent portion R4 to the fifth bent portion R5, the distance from the fifth bent portion R5 to the sixth bent portion R6, the distance from the sixth bent portion R6 to a bent portion R60, the distance from the bent portion R60 to a bent portion R61, and the distance from the bent portion R61 to the second end T2, and thus is longer than the creeping distance L1 in the semiconductor device shown in FIG. 6 and FIG. 7.

Modification 2

Figure 22:
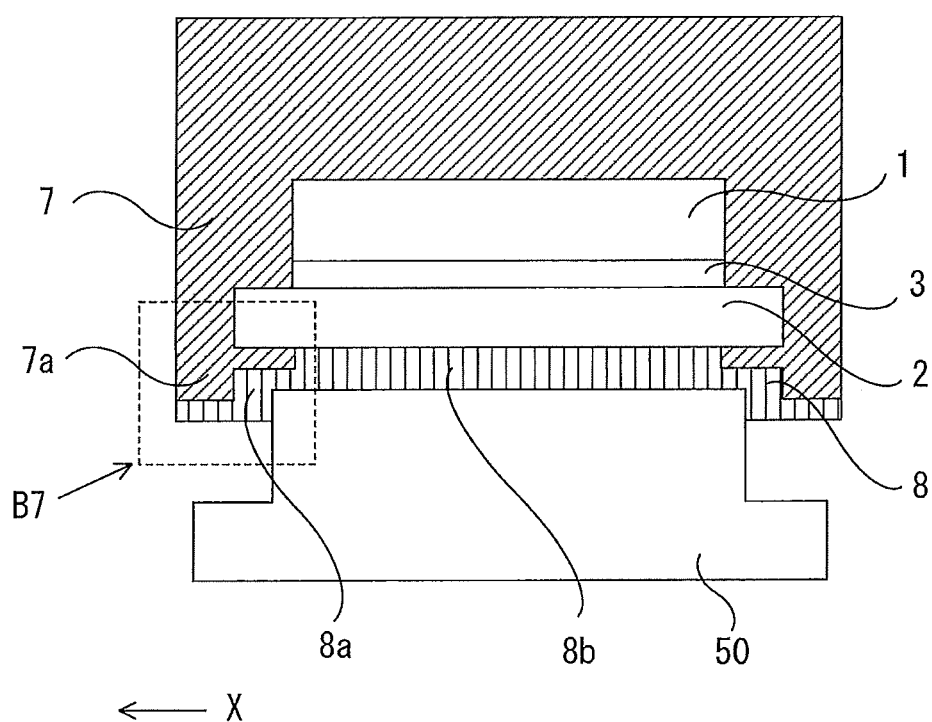
FIG. 22 is a sectional view of a semiconductor device in modification 2 of embodiment 2, along A-A line in FIG. 1.
Figure 23:
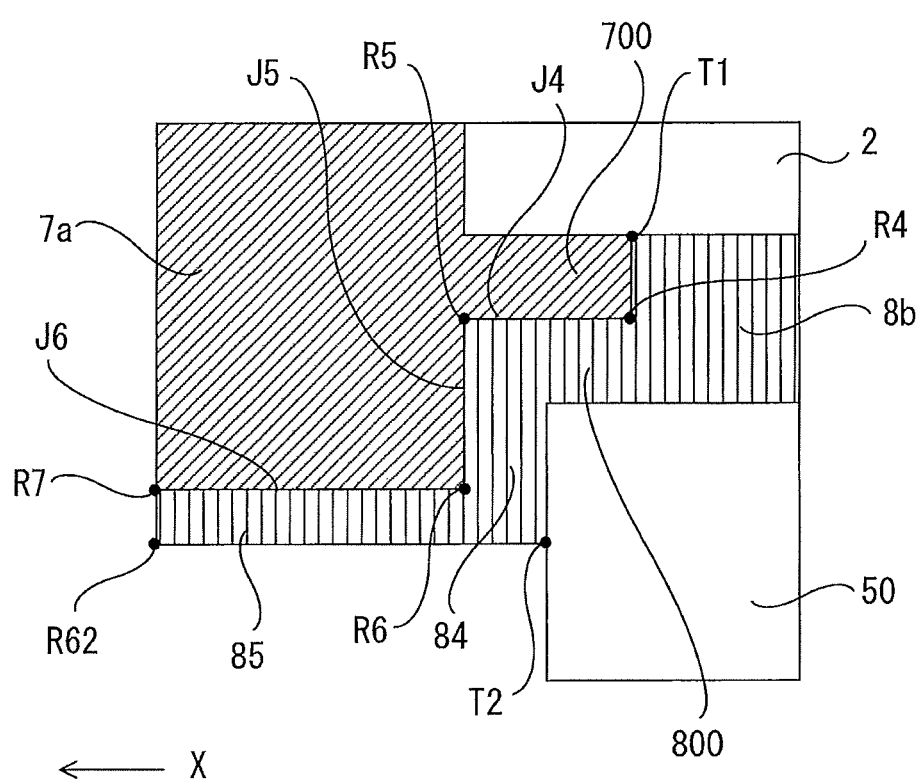
FIG. 23 is an enlarged view of part B7 of the semiconductor device shown in FIG. 22.

FIG. 22 is a sectional view of a semiconductor device in modification 2 of embodiment 2, along A-A line in FIG. 1, and corresponds to FIG. 4. FIG. 23 is an enlarged view of part B7 of the semiconductor device shown in FIG. 22.

In FIG. 22 and FIG. 23, the second skirt portion 8a has a fifth protrusion 85 protruding from the fourth protrusion 84 toward the side surface (X direction in the drawing) of the semiconductor device 100, and a seventh bent portion R7 is formed at the fifth protrusion 85. Part from the sixth bent portion R6 to the seventh bent portion R7 is a sixth joining portion J6 between the first skirt portion 7a and the second skirt portion 8a.

In such a configuration, the creeping distance from the lead frame 2 to the heatsink 50 is the sum of the distance from the first end T1 to the fourth bent portion R4, the distance from the fourth bent portion R4 to the fifth bent portion R5, the distance from the fifth bent portion R5 to the sixth bent portion R6, the distance from the sixth bent portion R6 to the seventh bent portion R7, the distance from the seventh bent portion R7 to a bent portion R62, and the distance from the bent portion R62 to the second end T2, and thus is longer than the creeping distance L1 in the semiconductor device shown in FIG. 6 and FIG. 7.

Figure 24:
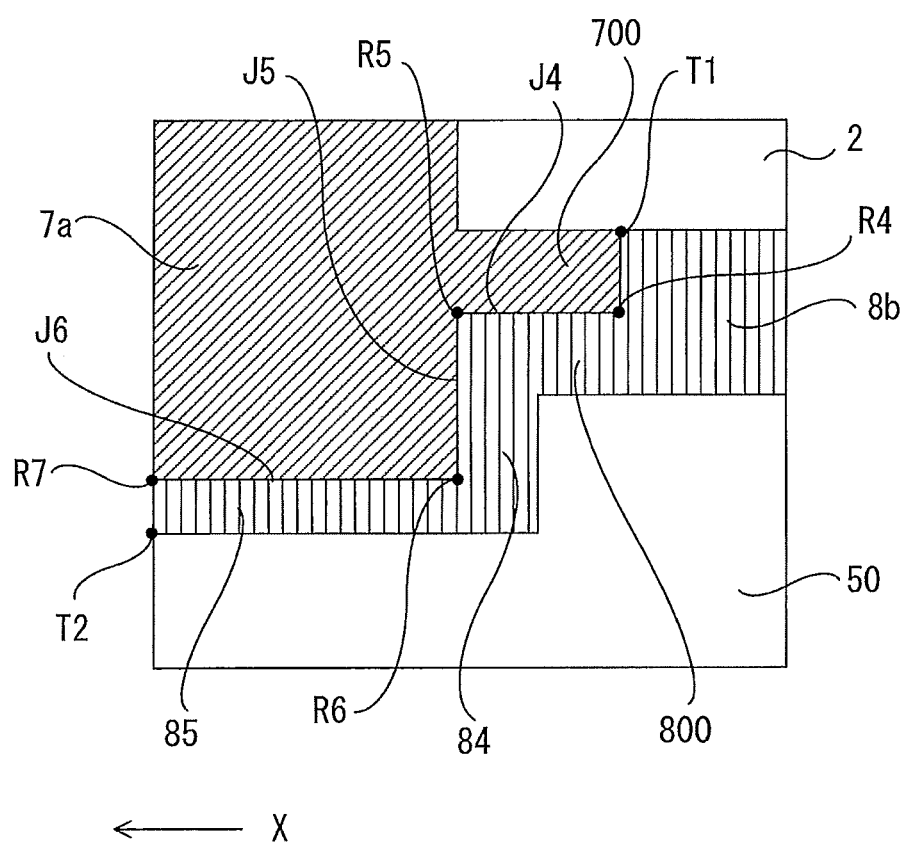
FIG. 24 is an enlarged view of a part of the semiconductor device in modification 2 of embodiment 2.

As shown in FIG. 24, the heatsink 50 may be joined to the heat dissipation surface side of the fifth protrusion 85 of the second skirt portion 8a. Also in this case, the creeping distance from the lead frame 2 to the heatsink 50 is the sum of the distance from the first end T1 to the fourth bent portion R4, the distance from the fourth bent portion R4 to the fifth bent portion R5, the distance from the fifth bent portion R5 to the sixth bent portion R6, the distance from the sixth bent portion R6 to the seventh bent portion R7, and the distance from the seventh bent portion R7 to the second end T2, and thus is longer than the creeping distance L1 in the semiconductor device shown in FIG. 6 and FIG. 7.

Modification 3

Figure 25:
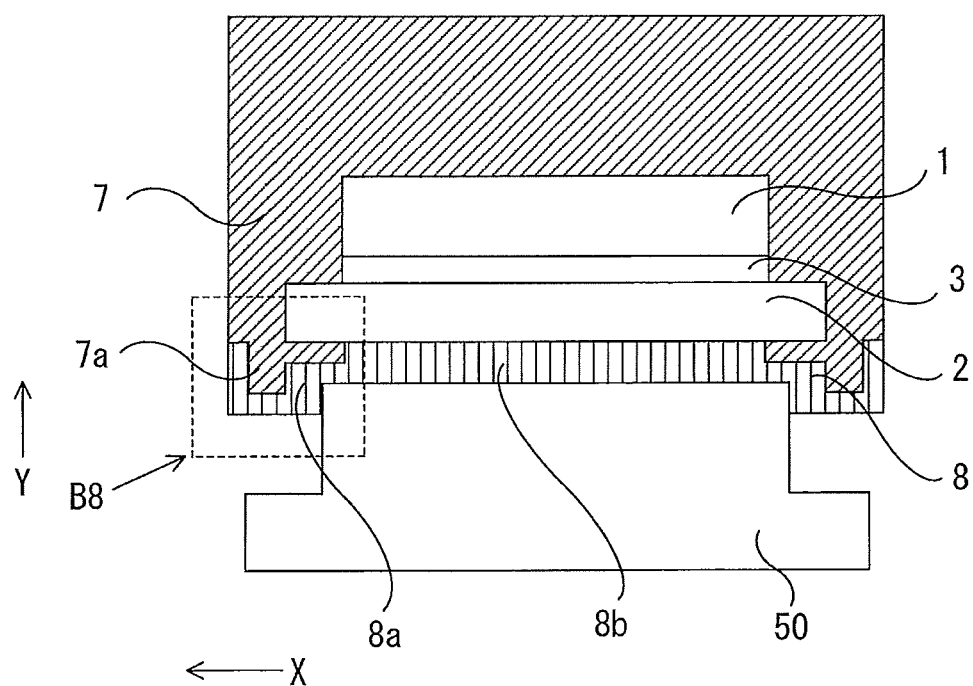
FIG. 25 is a sectional view of a semiconductor device in modification 3 of embodiment 2, along A-A line in FIG. 1.
Figure 26:
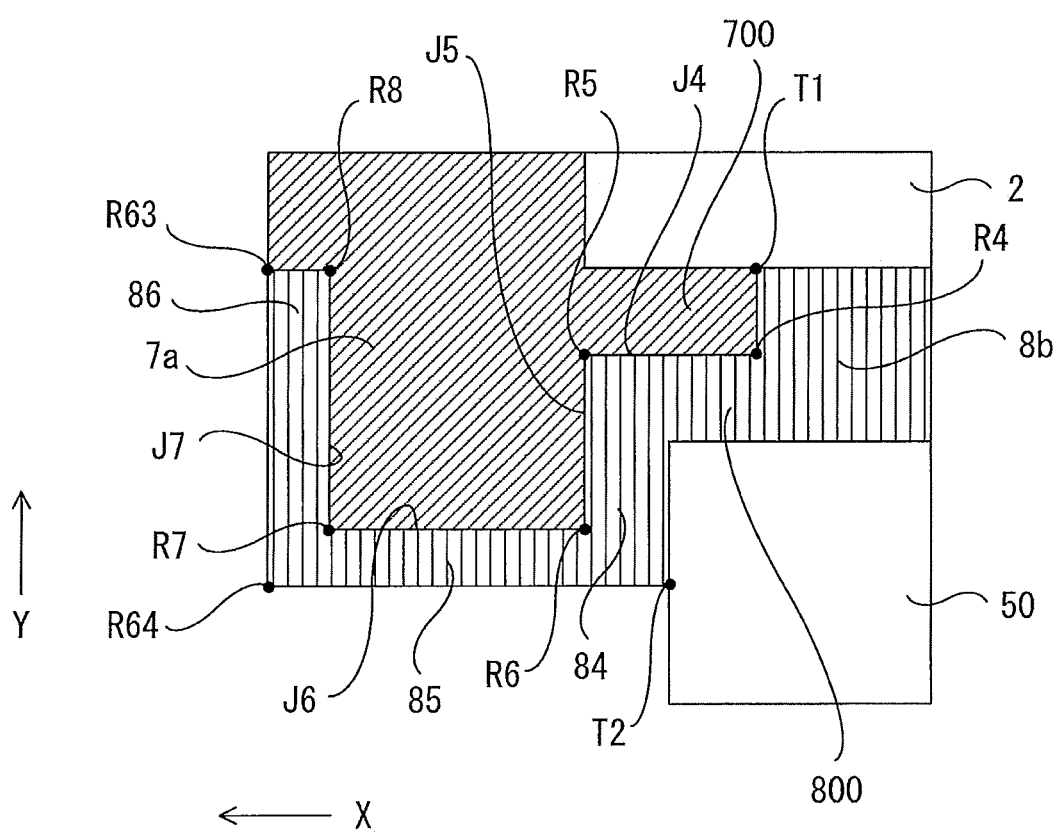
FIG. 26 is an enlarged view of part B8 of the semiconductor device shown in FIG. 25.

FIG. 25 is a sectional view of a semiconductor device in modification 3 of embodiment 2, along A-A line in FIG. 1, and corresponds to FIG. 4. FIG. 26 is an enlarged view of part B8 of the semiconductor device shown in FIG. 25.

In FIG. 25 and FIG. 26, the second skirt portion 8a has a sixth protrusion 86 protruding from the fifth protrusion 85 toward the mounting surface side (Y direction in the drawing) of the lead frame 2, and an eighth bent portion R8 is formed at the sixth protrusion 86. Part from the seventh bent portion R7 to the eighth bent portion R8 is a seventh joining portion J7 between the first skirt portion 7a and the second skirt portion 8a.

In such a configuration, the creeping distance from the lead frame 2 to the heatsink 50 is the sum of the distance from the first end T1 to the fourth bent portion R4, the distance from the fourth bent portion R4 to the fifth bent portion R5, the distance from the fifth bent portion R5 to the sixth bent portion R6, the distance from sixth bent portion R6 to the seventh bent portion R7, the distance from the seventh bent portion R7 to the eighth bent portion R8, the distance from the eighth bent portion R8 to a bent portion R63, the distance from the bent portion R63 to a bent portion R64, and the distance from the bent portion R64 to the second end T2, and thus is longer than the creeping distance L1 in the semiconductor device shown in FIG. 6 and FIG. 7.

Figure 27:
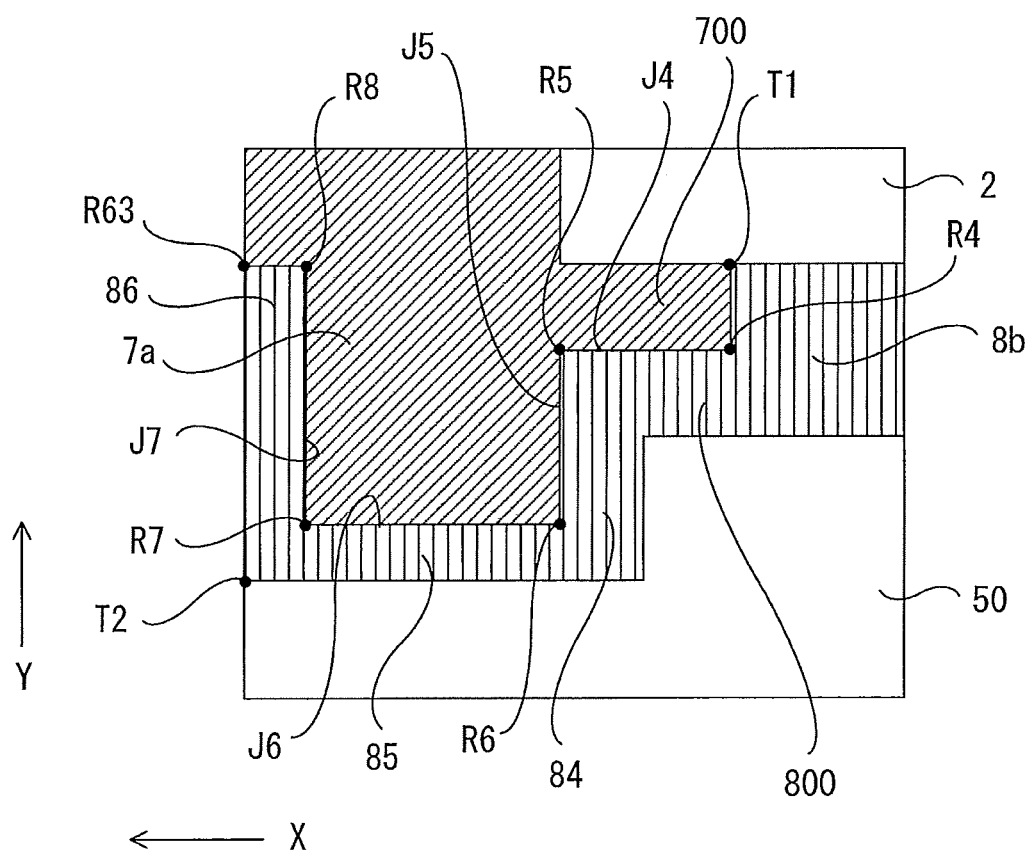
FIG. 27 is an enlarged view of a part of the semiconductor device in modification 3 of embodiment 2.

As shown in FIG. 27, the heatsink 50 may be jointed to the heat dissipation surface side of the fifth protrusion 85 of the second skirt portion 8a. Also in this case, the creeping distance from the lead frame 2 to the heatsink 50 is the sum of the distance from the first end T1 to the fourth bent portion R4, the distance from the fourth bent portion R4 to the fifth bent portion R5, the distance from the fifth bent portion R5 to the sixth bent portion R6, the distance from the sixth bent portion R6 to the seventh bent portion R7, the distance from the seventh bent portion R7 to the eighth bent portion R8, the distance from the eighth bent portion R8 to the bent portion R63, and the distance from the bent portion R63 to the second end T2, and thus is longer than the creeping distance L1 in the semiconductor device shown in FIG. 6 and FIG. 7.

As described above, in the present embodiment, the creeping distance from the lead frame to the heatsink is increased as compared to a conventional one, whereby insulation performance is improved.

Embodiment 3

Hereinafter, a semiconductor device according to embodiment 3 of the present invention will be described with reference to the drawings.

The entire configuration of the semiconductor device in the present embodiment is the same as that of the semiconductor device according to embodiment 1, and therefore mainly, only differences will be described. In the drawings, parts that are the same as or correspond to those in embodiment 1 are denoted by the same reference characters.

Figure 28:
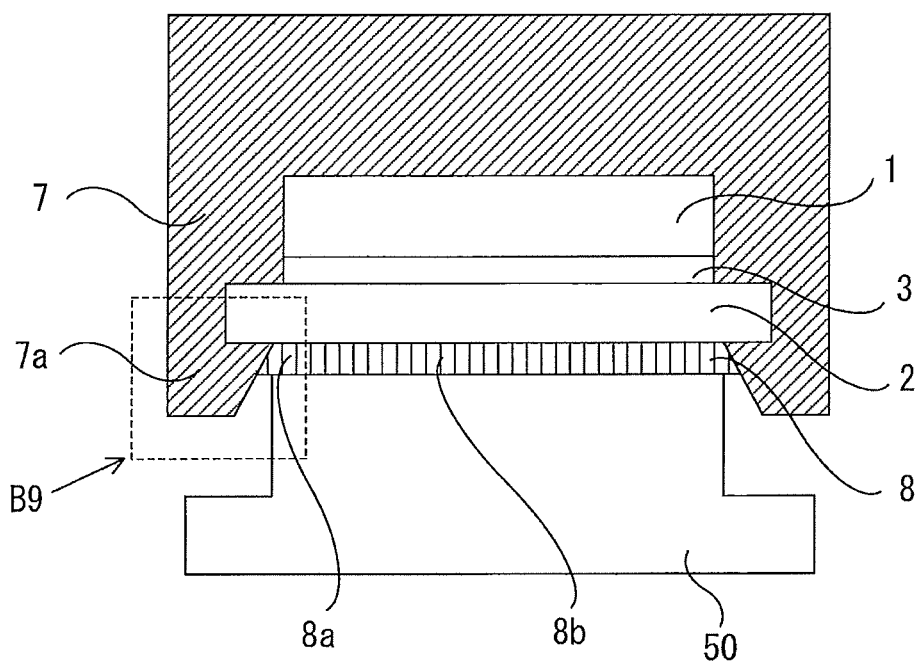
FIG. 28 is a sectional view of a semiconductor device in embodiment 3 of the present invention, along A-A line in FIG. 1.
Figure 29:
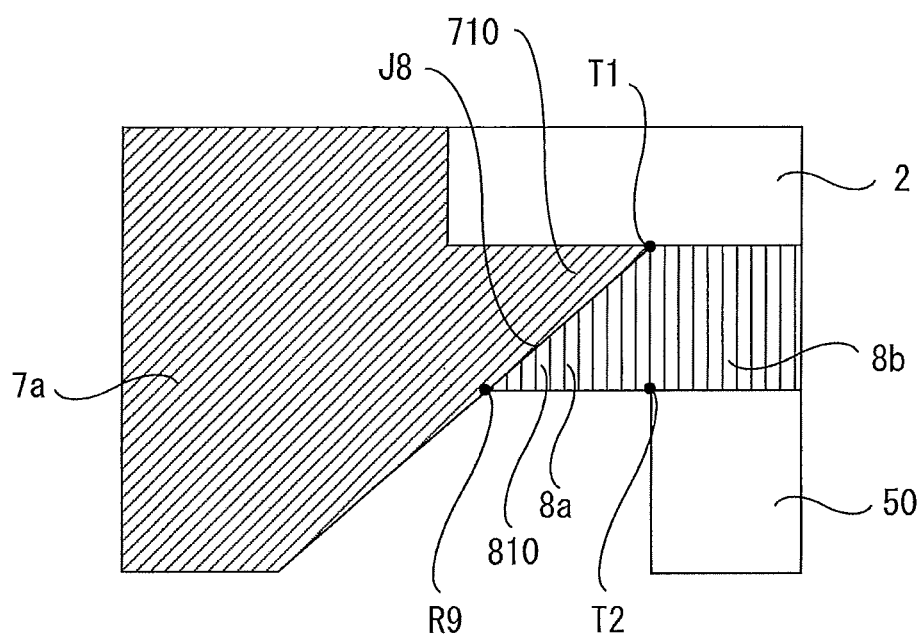
FIG. 29 is an enlarged view of part B9 of the semiconductor device shown in FIG. 28.

FIG. 28 is a sectional view of the semiconductor device in the present embodiment 3, along A-A line in FIG. 1, and corresponds to FIG. 4. FIG. 29 is an enlarged view of part B9 of the semiconductor device shown in FIG. 28.

In the present embodiment, as shown in FIG. 28 and FIG. 29, the second skirt portion 8a has, at an end of the thin molded portion 8b, a first slope portion 810 expanding toward the heat dissipation surface side of the thin molded portion 8b, and the first skirt portion 7a has a second wraparound portion 710 formed between the first slope portion 810 and the heat dissipation surface 2b of the lead frame 2. A ninth bent portion R9 is formed at an end of the first slope portion 810 of the second skirt portion 8a. Part from the first end T1 to the ninth bent portion R9 is an eighth joining portion J8 between the first skirt portion 7a and the second skirt portion 8a.

In the present embodiment, the creeping distance from the lead frame 2 to the heatsink 50 is the sum of the distance from the first end T1 to the ninth bent portion R9 and the distance from the ninth bent portion R9 to the second end T2, and thus is longer than the creeping distance (L1) in the semiconductor device shown in FIG. 6 and FIG. 7. Accordingly, insulation performance is improved.

Embodiment 4

Hereinafter, a semiconductor device according to embodiment 4 of the present invention will be described with reference to the drawings.

The entire configuration of the semiconductor device in the present embodiment is the same as that of the semiconductor device according to embodiment 1, and therefore mainly, only differences will be described. In the drawings, parts that are the same as or correspond to those in embodiment 1 are denoted by the same reference characters.

Figure 30:
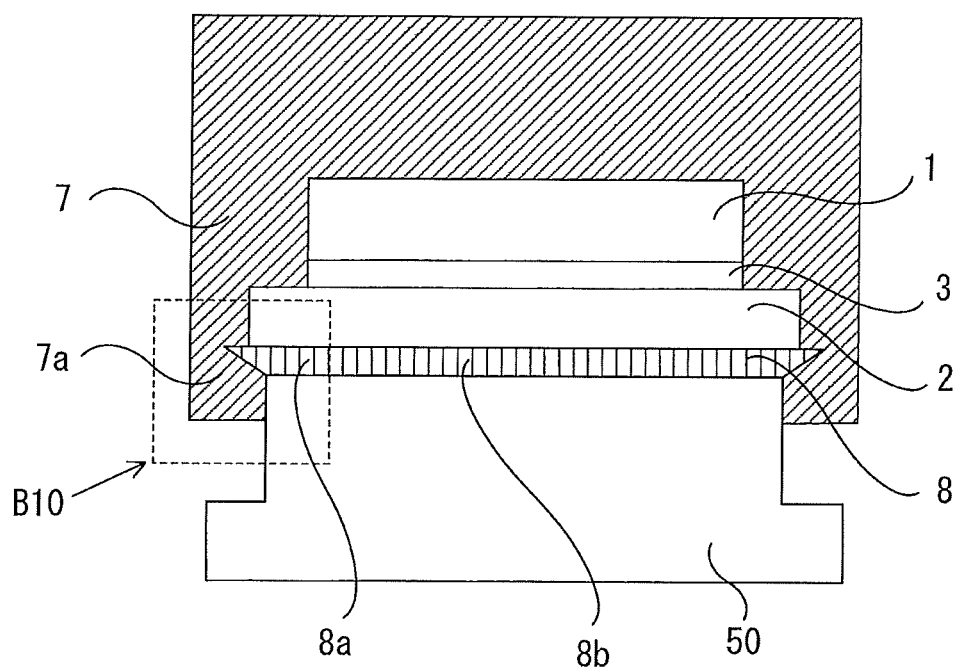
FIG. 30 is a sectional view of a semiconductor device in embodiment 4 of the present invention, along A-A line in FIG. 1.
Figure 31:
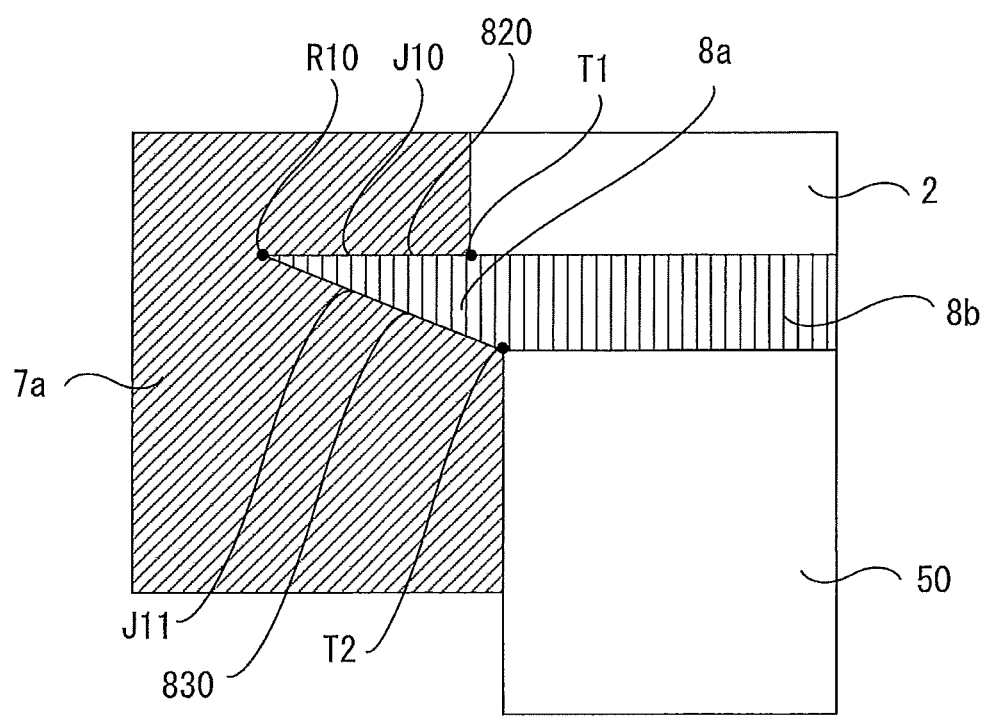
FIG. 31 is an enlarged view of part B10 of the semiconductor device shown in FIG. 30.

FIG. 30 is a sectional view of the semiconductor device in the present embodiment 4, along A-A line in FIG. 1, and corresponds to FIG. 4. FIG. 31 is an enlarged view of part B10 of the semiconductor device shown in FIG. 30.

In the present embodiment, as shown in FIG. 30 and FIG. 31, the second skirt portion 8a has a first straight portion 820 formed by extending the heat dissipation surface of the lead frame 2 from the first end T1, and has a tenth bent portion R10 at the first straight portion 820. Further, the second skirt portion 8a has a second slope portion 830 extending with an acute angle from the tenth bent portion R10 to the second end T2. Part from the first end T1 to the tenth bent portion R10 is a tenth joining portion J10 between the first skirt portion 7a and the second skirt portion 8a, and part from the tenth bent portion R10 to the second end T2 is an eleventh joining portion J11 between the first skirt portion 7a and the second skirt portion 8a.

In the present embodiment, the creeping distance from the lead frame 2 to the heatsink 50 is the sum of the distance from the first end T1 to the tenth bent portion R10 and the distance from the tenth bent portion R10 to the second end T2, and thus is longer than the creeping distance (L1) in the semiconductor device shown in FIG. 6 and FIG. 7. Accordingly, insulation performance is improved.

In addition, since the second skirt portion is embedded inside the first skirt portion, the semiconductor device having high adhesiveness between the thin molded portion and the lead frame can be obtained.

Embodiment 5

Hereinafter, a semiconductor device according to embodiment 5 of the present invention will be described with reference to the drawings. The entire configuration of the semiconductor device in the present embodiment is the same as that of the semiconductor device according to embodiment 1, and therefore mainly; only differences will be described. In the drawings, parts that are the same as or correspond to those in embodiment 1 are denoted by the same reference characters.

Figure 32:
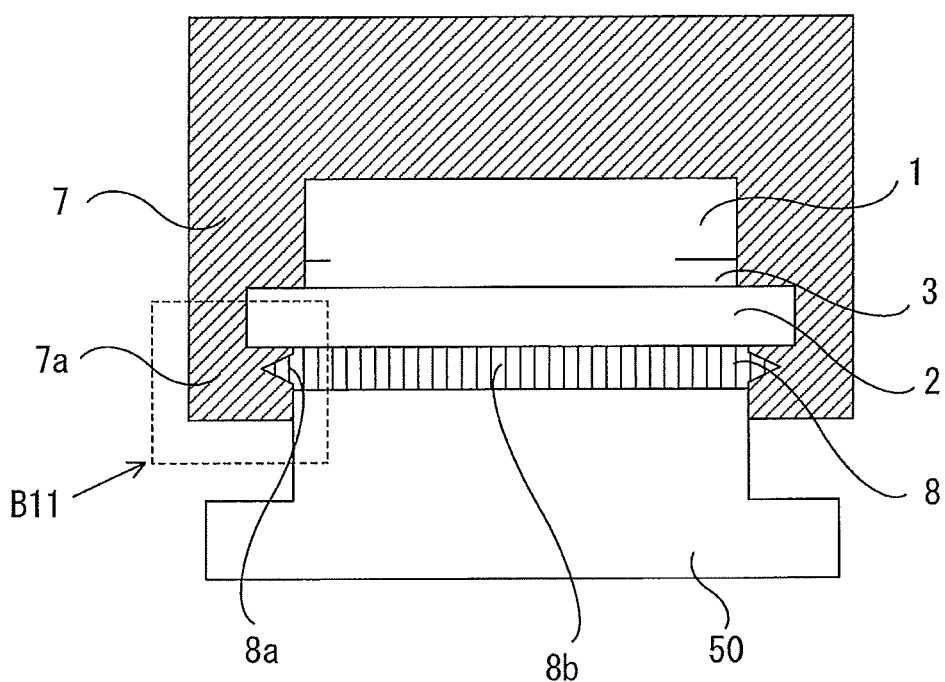
FIG. 32 is a sectional view of a semiconductor device in embodiment 5 of the present invention, along A-A line in FIG. 1.
Figure 33:
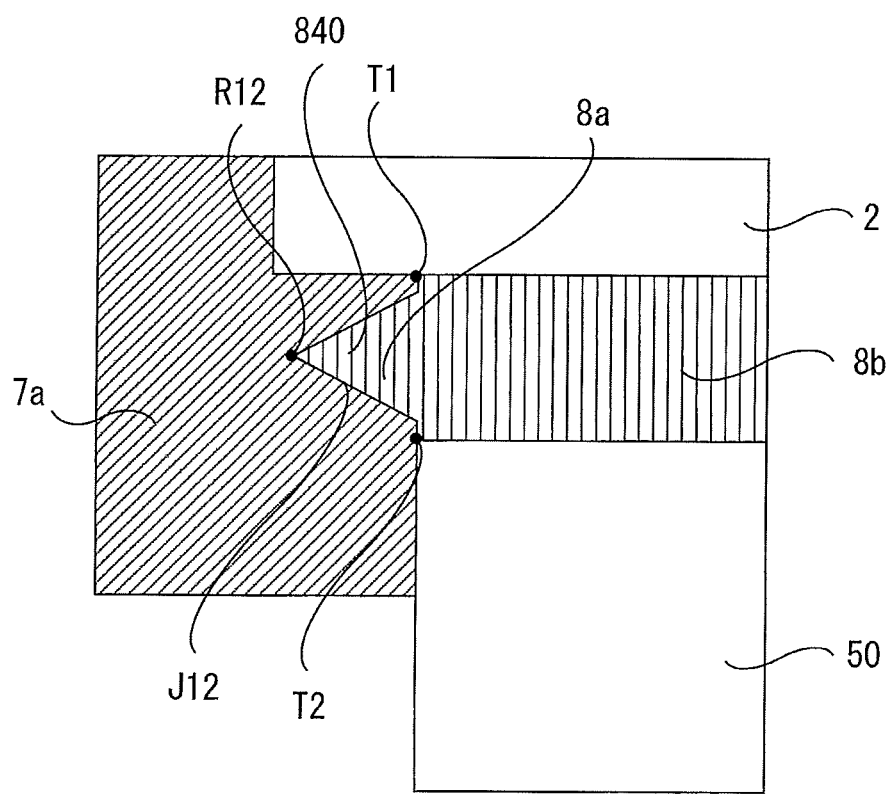
FIG. 33 is an enlarged view of part B11 of the semiconductor device shown in FIG. 32.

FIG. 32 is a sectional view of the semiconductor device in the present embodiment 5, along A-A line in FIG. 1, and corresponds to FIG. 4. FIG. 33 is an enlarged view of part B11 of the semiconductor device shown in FIG. 32.

In the present embodiment, as shown in FIG. 32 and FIG. 33, the second skirt portion 8a has a projection 840 formed in a projecting shape at an end of the thin molded portion 8b, and a twelfth bent portion R12 is formed at the projection 840. Part from the first end T1 through the twelfth bent portion R12 to the second end T2 is a twelfth joining portion J12 between the first skirt portion 7a and the second skirt portion 8a. Since the second skirt portion 8a has the projection 840, in the case of using a mold of a type in which dies are opened in the up-down direction, the mold is caught by the projection 840. Therefore, the second skirt portion 8a is formed using a mold having a mechanism such as a slide core that is movable in the right-left direction in the drawing and allows mold release without being caught by the projection 840. Alternatively, the first skirt portion 7a is formed using a mold having a mechanism such as a slide core that is movable in the front-back direction in the drawing and allows mold release without being caught by the recess of the first skirt portion 7a that is opposed to the projection 840.

In the present embodiment, the creeping distance from the lead frame 2 to the heatsink 50 is the sum of the distance from the first end T1 to the twelfth bent portion R12 and the distance from the twelfth bent portion R12 to the second end T2, and thus is longer than the creeping distance (L1) in the semiconductor device shown in FIG. 6 and FIG. 7. Accordingly, insulation performance is improved.

In addition, since the second skirt portion 8a is embedded inside the first skirt portion 7a, the semiconductor device having high adhesiveness between the thin molded portion 8b and the lead frame 2 can be obtained.

Figure 34:
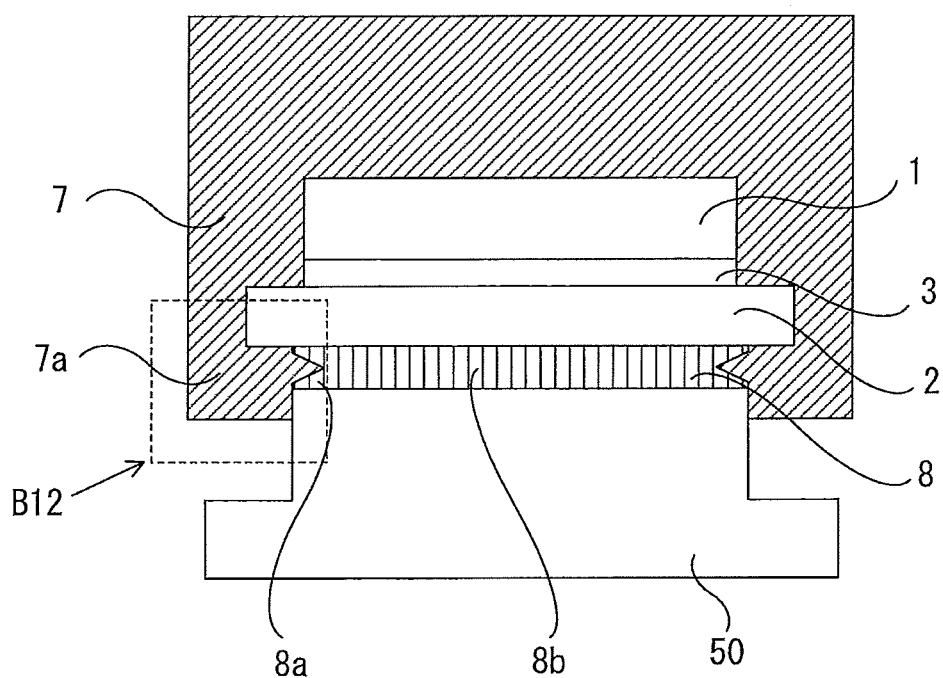
FIG. 34 is a sectional view of a semiconductor device in another example of embodiment 5 of the present invention, along A-A line in FIG. 1.
Figure 35:
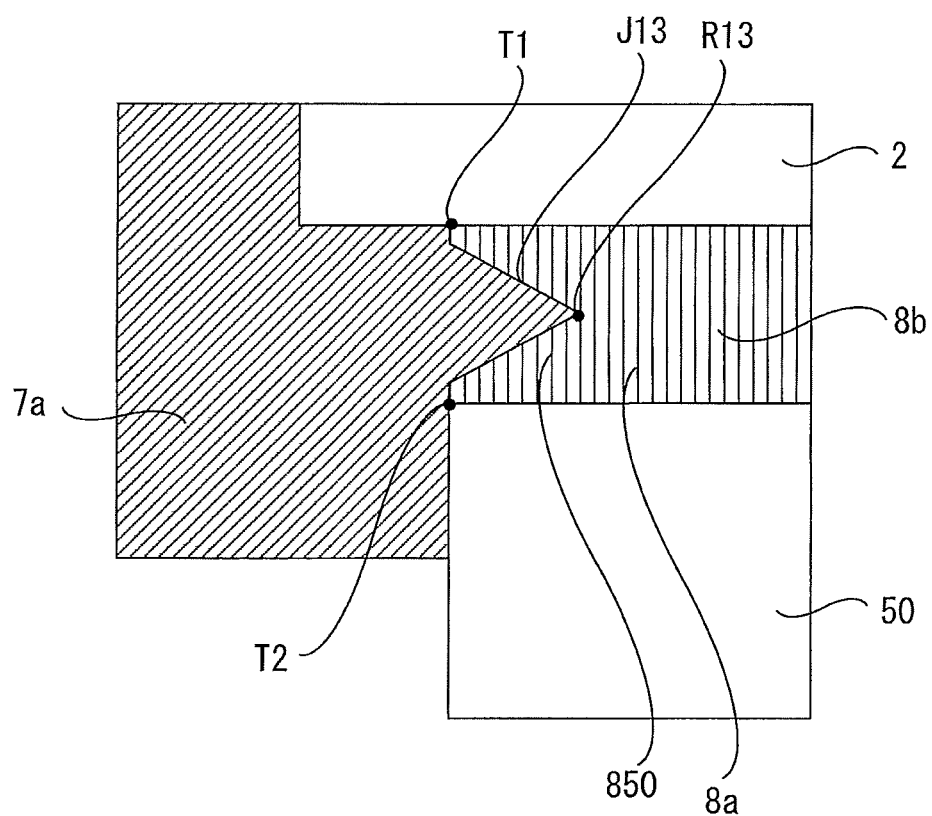
FIG. 35 is an enlarged view of part B12 of the semiconductor device shown in FIG. 34.

FIG. 34 is a sectional view of a semiconductor device in another example of the present embodiment 5, along A-A line in FIG. 1, and corresponds to FIG. 4. FIG. 35 is an enlarged view of part B12 of the semiconductor device shown in FIG. 34.

In the present example, as shown in FIG. 34 and FIG. 35, the second skirt portion 8a has a recess 850 formed in a recessed shape at an end of the thin molded portion 8b, and a thirteenth bent portion R13 is formed at the recess 850. Part from the first end T1 through the thirteenth bent portion R13 to the second end T2 is a thirteenth joining portion J13 between the first skirt portion 7a and the second skirt portion 8a. Since the second skirt portion 8a has the recess 850, in the case of using a mold of a type in which dies are opened in the up-down direction, the mold is caught by the recess 850. Therefore, the second skirt portion 8a is formed using a mold having a mechanism such as a slide core that is movable in the right-left direction in the drawing and allows mold release without being caught by the recess 850. Alternatively, the first skirt portion 7a is formed using a mold having a mechanism such as a slide core that is movable in the front-back direction in the drawing and allows mold release without being caught by the projection of the first skirt portion 7a that is opposed to the recess 850.

In the present example, the creeping distance from the lead frame 2 to the heatsink 50 is the sum of the distance from the first end T1 to the thirteenth bent portion R13 and the distance from the thirteenth bent portion R13 to the second end T2, and thus is longer than the creeping distance (L1) in the semiconductor device shown in FIG. 6 and FIG. 7. Accordingly, insulation performance is improved.

In addition, since the first skirt portion 7a is embedded inside the second skirt portion 8a, the semiconductor device having high adhesiveness between the thin molded portion 8b and the lead frame 2 can be obtained.

Figure 36:
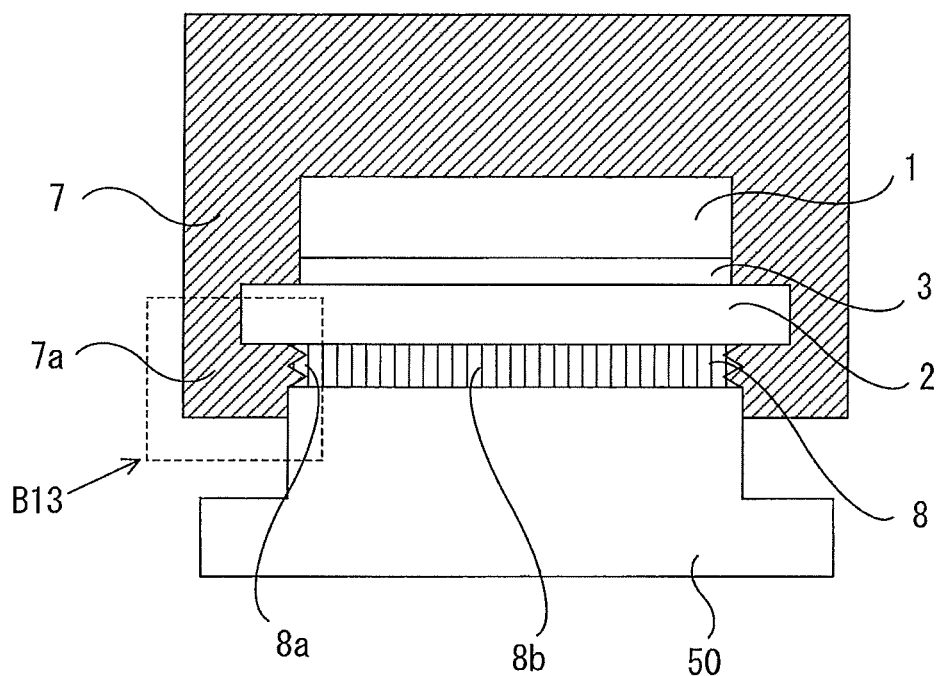
FIG. 36 is a sectional view of a semiconductor device in another example of embodiment 5 of the present invention, along A-A line in FIG. 1.
Figure 37:
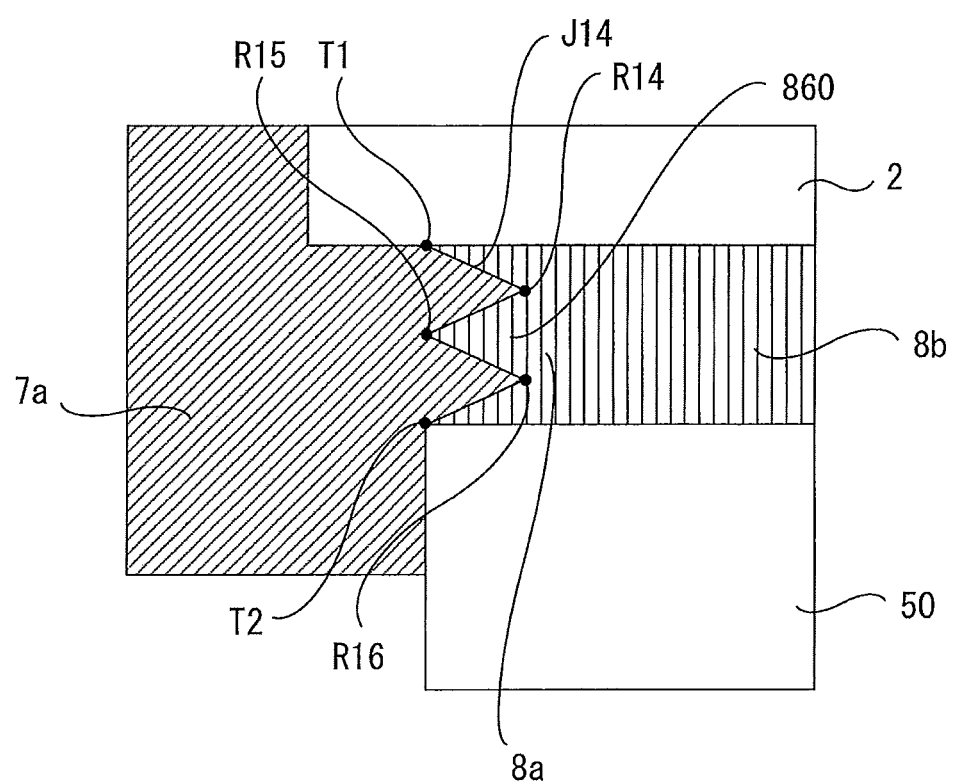
FIG. 37 is an enlarged view of part B13 of the semiconductor device shown in FIG. 36.

FIG. 36 is a sectional view of a semiconductor device in another example of the present embodiment 5, along A-A line in FIG. 1, and corresponds to FIG. 4. FIG. 37 is an enlarged view of part B13 in the semiconductor device shown in FIG. 36.

In the present example, as shown in FIG. 36 and FIG. 37, the second skirt portion 8a has a recessed and projecting portion 860 formed in a recessed and projecting shape at an end of the thin molded portion 8b, and a plurality of bent portions (fourteenth bent portion R14, fifteenth bent portion R15, sixteenth bent portion R16) are formed at the recessed and projecting portion 860. Part from the first end T1 through the plurality of bent portions (fourteenth bent portion R14, fifteenth bent portion R15, sixteenth bent portion R16) to the second end T2 is a fourteenth joining portion J14 between the first skirt portion 7a and the second skirt portion 8a. Since the second skirt portion 8a has the recessed and projecting portion 860, in the case of using a mold of a type in which dies are opened in the up-down direction, the mold is caught by the recessed and projecting portion 860. Therefore, the second skirt portion 8a is formed using a mold having a mechanism such as a slide core that is movable in the right-left direction in the drawing and allows mold release without being caught by the recessed and projecting portion 860. Alternatively, the first skirt portion 7a is formed using a mold having a mechanism such as a slide core that is movable in the front-back direction in the drawing and allows mold release without being caught by the recessed and projecting portion 860.

In the present example, the creeping distance from the lead frame 2 to the heatsink 50 is a distance from the first end T1 through the plurality of bent portions (fourteenth bent portion R14, fifteenth bent portion R15, sixteenth bent portion R16) to the second end T2, and thus is longer than the creeping distance (L1) in the semiconductor device shown in FIG. 6 and FIG. 7. Accordingly, insulation performance is improved.

Since the first skirt portion 7a and the second skirt portion 8a are embedded into each other, the semiconductor device having high adhesiveness between the thin molded portion 8b and the lead frame 2 can be obtained.

Embodiment 6

A semiconductor device according to the present embodiment is a modification of the semiconductor devices according to the above embodiments, and the entire configuration thereof is the same. Therefore, only differences will be described. In the drawings, parts that are the same as or correspond to those in the above embodiment are denoted by the same reference characters.

Figure 38:
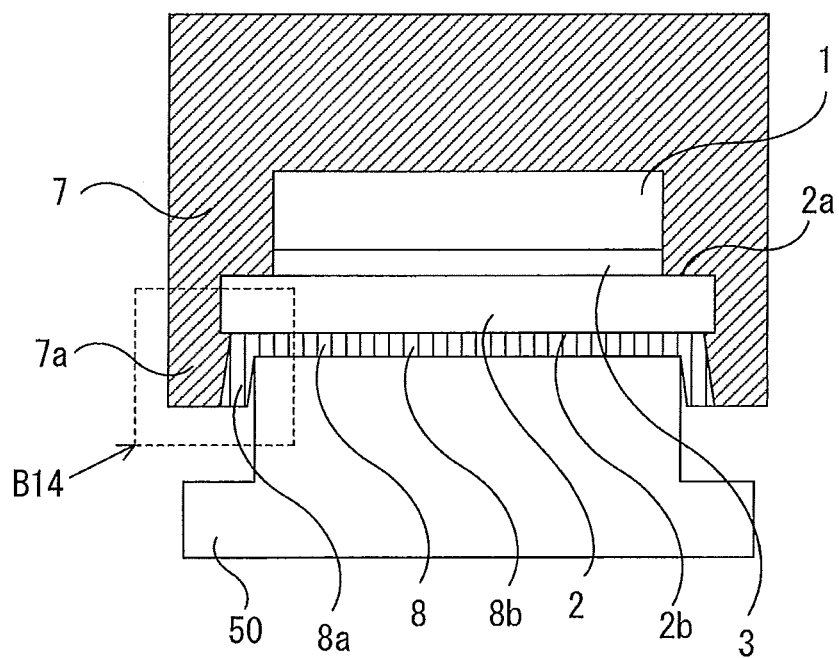
FIG. 38 is a sectional view of a semiconductor device in embodiment 6 of the present invention, along A-A line in FIG. 1.
Figure 39:
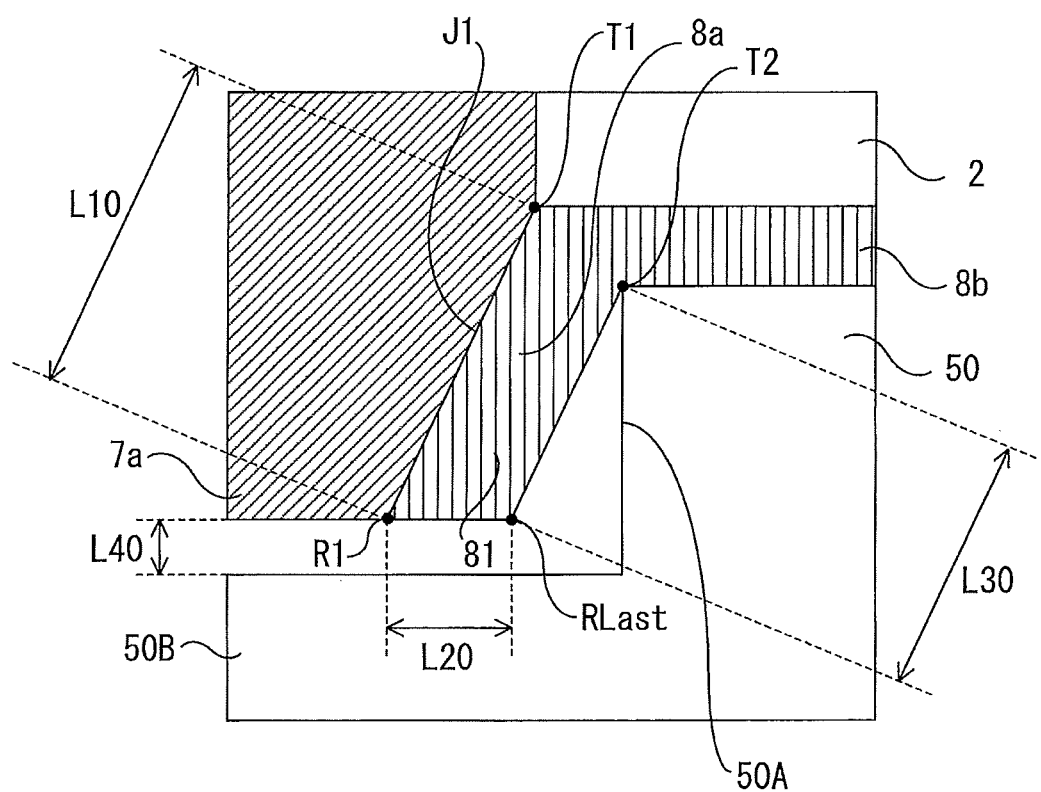
FIG. 39 is an enlarged view of part B14 of the semiconductor device shown in FIG. 38.

FIG. 38 is a sectional view of the semiconductor device in the present embodiment, along A-A line in FIG. 1, and corresponds to FIG. 4 in embodiment 1. FIG. 39 is an enlarged view of part B14 of the semiconductor device shown in FIG. 38, and corresponds to FIG. 5 in embodiment 1. In the present embodiment, as shown in FIG. 39, the outer peripheral surface part of the second skirt portion 8a has the first end T1 connected to the lead frame 2 and the first skirt portion 7a, and the second end T2 connected to the heatsink 50. Between the first end T1 and the second end T2, the first bent portion R1 and a last bent portion RLast are formed. It is noted that the last bent portion RLast means a last bent portion as counted from the first end T1.

Of the outer peripheral surface part of the second skirt portion 8a, part from the second end T2 to the last bent portion RLast is sloped in such a direction as to be separated from the opposed surface (side surface portion 50A) of the heatsink 50. In this case, part from the first end T1 to the second end T2 of the second skirt portion 8a is not in contact with the heatsink 50. It is noted that, in FIG. 39, the last bent portion RLast has an angular shape, but may have a round curved-surface shape. In addition, of the outer peripheral surface part of the second skirt portion 8a, part from the first end T1 to the first bent portion R1 is sloped in such a direction as to be separated from the opposed surface (side surface portion 50A) of the heatsink 50, but may not have a sloped shape.

In the present embodiment, the creeping distance from the lead frame 2 to the heatsink 50 is the sum (L10+L20+L30) of a distance L10 from the first end T1 to the first bent portion R1, a distance L20 from the first bent portion R1 to the last bent portion RLast, and a distance L30 from the last bent portion RLast to the second end T2, and thus is longer than the creeping distance (L1+L2) in the semiconductor device shown in FIG. 4 and FIG. 5. Accordingly, insulation performance is improved. This configuration is effective in the case where the sum (L20+L30) of the distance L20 and the distance L30 is greater than a distance L40 between a side-surface protrusion 50B of the heatsink 50, and the first skirt portion 7a and the second skirt portion 8a. In addition, since part from the second end T2 to the last bent portion RLast, which is one side surface of the second skirt portion 8a, is not in contact with the heatsink 50, interference can be prevented during assembly. Thus, assembly performance is improved. When the second skirt portion 8a is molded, part from the second end T2 to the last bent portion RLast of the outer peripheral surface part of the second skirt portion 8a has a sloped shape, whereby an effect of facilitating mold release is obtained.

In the above embodiment 6, an example corresponding to the semiconductor device shown in FIG. 4 and FIG. 5 in embodiment 1 has been described. However, the above configuration is also applicable to FIG. 8, FIG. 9, FIG. 10, FIG. 11 and FIG. 12, FIG. 13, FIG. 14 and FIG. 15, and FIG. 16 in embodiment 1. In addition, the above configuration is also applicable to FIG. 19 and FIG. 20, FIG. 21, FIG. 22 and FIG. 23, FIG. 24, FIG. 25 and FIG. 26, and FIG. 27 in embodiment 2.

Embodiment 7

A semiconductor device according to the present embodiment is a modification of the semiconductor devices according to the above embodiments 1 to 6, and the entire configuration thereof is the same. Therefore, only differences will be described.

In the present embodiment, the joining surfaces of the first skirt portion 7a and the second skirt portion 8a in the semiconductor devices of the above embodiments 1 to 6 are roughened. Roughening the joining surfaces of the first skirt portion 7a and the second skirt portion 8a improves adhesiveness between the first skirt portion 7a and the second skirt portion 8a, leading to improvement in insulation performance. In addition, a semiconductor device having high heat dissipation property and improved reliability is obtained. After the first skirt portion 7a is molded and before the second skirt portion 8a is molded, or after the second skirt portion 8a is molded and before the first skirt portion 7a is molded, laser working may be performed so that the surface roughness of the first skirt portion 7a or the second skirt portion 8a becomes about 0.06 to 0.2 or greater in Ra (arithmetic average roughness). Without limitation to laser working, any other working methods for increasing the surface roughness can obtain the same effects. Alternatively, the mold surface roughness of the first skirt portion 7a or the second skirt portion 8a that is first formed by transfer molding may be set to about 20 or greater in Rz (ten-point average roughness), whereby the same effects are obtained.

It is noted that, within the scope of the present invention, the above embodiments may be freely combined with each other, or each of the above embodiments may be modified or simplified as appropriate.

The invention claimed is:

1. A semiconductor device comprising:
a lead frame with a semiconductor element mounted thereto;
a first insulation resin portion formed on a mounting surface side of the lead frame on which the semiconductor element is mounted;
a second insulation resin portion formed on a heat dissipation surface side of the lead frame which is opposite to the mounting surface side and which is at least in part under the lead frame; and
a heatsink fixed to a heat dissipation surface of the second insulation resin portion, wherein
the second insulation resin portion has a thin molded portion in close contact with the lead frame, and a second skirt portion formed at an end of the thin molded portion,
the first insulation resin portion has a first skirt portion protruding toward the heat dissipation surface side of the lead frame and covering the second skirt portion of the second insulation resin portion,
an outer peripheral surface part of the second skirt portion has a first end connected to the lead frame and the first skirt portion, a second end connected to the heatsink, and at least one bent portion formed between the first end and the second end,
the second skirt portion has a first protrusion protruding toward the heat dissipation surface side of the second insulation resin portion,
the bent portion includes a first bent portion formed at the first protrusion,
part from the first end to the first bent portion is a first joining portion between the first skirt portion and the second skirt portion,
the second skirt portion has a second protrusion protruding from the first protrusion toward a side surface of the semiconductor device,
the bent portion includes a second bent portion formed at the second protrusion,
part from the first bent portion to the second bent portion is a second joining portion between the first skirt portion and the second skirt portion, and
an outer peripheral surface part of the second protrusion that is on a downward side of the second protrusion is not covered by the first skirt portion, and a free space is provided under, and directly adjacent to, the second protrusion.

2. The semiconductor device according to claim 1, wherein
the bent portion includes a last bent portion leading to the second end, and part from the second end to the last bent portion is sloped in such a direction as to be separated from an opposed surface of the heatsink.

3. The semiconductor device according to claim 1, wherein
joining surfaces of the first skirt portion and the second skirt portion are roughened.

4. The semiconductor device according to claim 1, wherein
thermal conductivity of the second insulation resin portion is equal to or greater than thermal conductivity of the first insulation resin portion.

5. A semiconductor device comprising:
a lead frame with a semiconductor element mounted thereto;
a first insulation resin portion formed on a mounting surface side of the lead frame on which the semiconductor element is mounted;
a second insulation resin portion formed on a heat dissipation surface side of the lead frame which is opposite to the mounting surface side; and
a heatsink fixed to a heat dissipation surface of the second insulation resin portion, wherein
the second insulation resin portion has a thin molded portion in close contact with the lead frame, and a second skirt portion formed at an end of the thin molded portion,
the first insulation resin portion has a first skirt portion protruding toward the heat dissipation surface side of the lead frame and covering the second skirt portion of the second insulation resin portion,
an outer peripheral surface part of the second skirt portion has a first end connected to the lead frame and the first skirt portion, a second end connected to the heatsink, and at least one bent portion formed between the first end and the second end,
the second skirt portion has a first protrusion protruding toward the heat dissipation surface side of the second insulation resin portion,
the bent portion includes a first bent portion formed at the first protrusion,
part from the first end to the first bent portion is a first joining portion between the first skirt portion and the second skirt portion,
the second skirt portion has a second protrusion protruding from the first protrusion toward a side surface of the semiconductor device,
the bent portion includes a second bent portion formed at the second protrusion,
part from the first bent portion to the second bent portion is a second joining portion between the first skirt portion and the second skirt portion,
the second skirt portion has a third protrusion protruding from the second protrusion toward the mounting surface side of the lead frame,
the bent portion includes a third bent portion formed at the third protrusion, and
part from the second bent portion to the third bent portion is a third joining portion between the first skirt portion and the second skirt portion.

6. The semiconductor device according to claim 5, wherein
the bent portion includes a last bent portion leading to the second end, and part from the second end to the last bent portion is sloped in such a direction as to be separated from an opposed surface of the heatsink.

7. A semiconductor device comprising:
a lead frame with a semiconductor element mounted thereto;
a first insulation resin portion formed on a mounting surface side of the lead frame on which the semiconductor element is mounted;

a second insulation resin portion formed on a heat dissipation surface side of the lead frame which is opposite to the mounting surface side; and a heatsink fixed to a heat dissipation surface of the second insulation resin portion, wherein the second insulation resin portion has a thin molded portion in close contact with the lead frame, and a second skirt portion formed at an end of the thin molded portion, the first insulation resin portion has a first skirt portion protruding toward the heat dissipation surface side of the lead frame and covering the second skirt portion of the second insulation resin portion, an outer peripheral surface part of the second skirt portion has a first end connected to the lead frame and the first skirt portion, a second end connected to the heatsink, and at least one bent portion formed between the first end and the second end, the second skirt portion has a step portion extending in parallel with the lead frame from an end of the thin molded portion, the first skirt portion has a first wraparound portion formed between the step portion and the heat dissipation surface of the lead frame, the bent portion includes a fourth bent portion and a fifth bent portion formed along a fourth joining portion between the step portion and the first wraparound portion, the second skirt portion has a fourth protrusion protruding from the step portion toward the heat dissipation surface side of the thin molded portion, the bent portion includes a sixth bent portion formed at the fourth protrusion, and part from the fifth bent portion to the sixth bent portion is a fifth joining portion between the first skirt portion and the second skirt portion.

8. The semiconductor device according to claim 7, wherein the second skirt portion has a fifth protrusion protruding from the fourth protrusion toward a side surface of the semiconductor device, the bent portion includes a seventh bent portion formed at the fifth protrusion, and part from the sixth bent portion to the seventh bent portion is a sixth joining portion between the first skirt portion and the second skirt portion.

9. The semiconductor device according to claim 8, wherein the second skirt portion has a sixth protrusion protruding from the fifth protrusion toward the mounting surface side of the lead frame, the bent portion has an eighth bent portion formed at the sixth protrusion, and part from the seventh bent portion to the eighth bent portion is a seventh joining portion between the first skirt portion and the second skirt portion.

10. The semiconductor device according to claim 7, wherein the bent portion includes a last bent portion leading to the second end, and part from the second end to the last bent portion is sloped in such a direction as to be separated from an opposed surface of the heatsink.

11. The semiconductor device according to claim 8, wherein the bent portion includes a last bent portion leading to the second end, and part from the second end to the last bent portion is sloped in such a direction as to be separated from an opposed surface of the heatsink.

12. The semiconductor device according to claim 9, wherein the bent portion includes a last bent portion leading to the second end, and part from the second end to the last bent portion is sloped in such a direction as to be separated from an opposed surface of the heatsink.

13. A semiconductor device comprising:

a lead frame with a semiconductor element mounted thereto;

a first insulation resin portion formed on a mounting surface side of the lead frame on which the semiconductor element is mounted;

a second insulation resin portion formed on a heat dissipation surface side of the lead frame which is opposite to the mounting surface side; and a heatsink fixed to a heat dissipation surface of the second insulation resin portion, wherein the second insulation resin portion has a thin molded portion in close contact with the lead frame, and a second skirt portion formed at an end of the thin molded portion, the first insulation resin portion has a first skirt portion protruding toward the heat dissipation surface side of the lead frame and covering the second skirt portion of the second insulation resin portion, an outer peripheral surface part of the second skirt portion has a first end connected to the lead frame and the first skirt portion, a second end connected to the heatsink, and at least one bent portion formed between the first end and the second end, the second skirt portion has a first straight portion formed by extending the heat dissipation surface of the lead frame from the first end, the bent portion includes a tenth bent portion formed at the first straight portion, the second skirt portion has a second slope portion extending with an acute angle from the tenth bent portion to the second end, and part from the first end to the tenth bent portion is a tenth joining portion between the first skirt portion and the second skirt portion, and part from the tenth bent portion to the second end is an eleventh joining portion between the first skirt portion and the second skirt portion.

14. The semiconductor device according to claim 13, wherein joining surfaces of the first skirt portion and the second skirt portion are roughened.

15. A semiconductor device comprising:

a lead frame with a semiconductor element mounted thereto;

a first insulation resin portion formed on a mounting surface side of the lead frame on which the semiconductor element is mounted;

a second insulation resin portion formed on a heat dissipation surface side of the lead frame which is opposite to the mounting surface side; and a heatsink fixed to a heat dissipation surface of the second insulation resin portion, wherein the second insulation resin portion has a thin molded portion in close contact with the lead frame, and a second skirt portion formed at an end of the thin molded portion, the first insulation resin portion has a first skirt portion protruding toward the heat dissipation surface side of the lead frame and covering the second skirt portion of the second insulation resin portion, an outer peripheral surface part of the second skirt portion has a first end connected to the lead frame and the first skirt portion, a second end connected to the heatsink, and at least one bent portion formed between the first end and the second end, the second skirt portion has a projection formed in a projecting shape at an end of the thin molded portion, the bent portion includes a twelfth bent portion formed at the projection, and part from the first end through the twelfth bent portion to the second end is a twelfth joining portion between the first skirt portion and the second skirt portion.

16. The semiconductor device according to claim 15, wherein joining surfaces of the first skirt portion and the second skirt portion are roughened.

17. A semiconductor device comprising:

a lead frame with a semiconductor element mounted thereto;

a first insulation resin portion formed on a mounting surface side of the lead frame on which the semiconductor element is mounted;

a second insulation resin portion formed on a heat dissipation surface side of the lead frame which is opposite to the mounting surface side; and a heatsink fixed to a heat dissipation surface of the second insulation resin portion, wherein the second insulation resin portion has a thin molded portion in close contact with the lead frame, and a second skirt portion formed at an end of the thin molded portion, the first insulation resin portion has a first skirt portion protruding toward the heat dissipation surface side of the lead frame and covering the second skirt portion of the second insulation resin portion, an outer peripheral surface part of the second skirt portion has a first end connected to the lead frame and the first skirt portion, a second end connected to the heatsink, and at least one bent portion formed between the first end and the second end, the second skirt portion has a recess formed in a recessed shape at an end of the thin molded portion, the bent portion includes a thirteenth bent portion formed at the recess, and part from the first end through the thirteenth bent portion to the second end is a thirteenth joining portion between the first skirt portion and the second skirt portion.

18. The semiconductor device according to claim 17, wherein joining surfaces of the first skirt portion and the second skirt portion are roughened.

19. A semiconductor device comprising:

a lead frame with a semiconductor element mounted thereto;

a first insulation resin portion formed on a mounting surface side of the lead frame on which the semiconductor element is mounted;

a second insulation resin portion formed on a heat dissipation surface side of the lead frame which is opposite to the mounting surface side; and a heatsink fixed to a heat dissipation surface of the second insulation resin portion, wherein the second insulation resin portion has a thin molded portion in close contact with the lead frame, and a second skirt portion formed at an end of the thin molded portion, the first insulation resin portion has a first skirt portion protruding toward the heat dissipation surface side of the lead frame and covering the second skirt portion of the second insulation resin portion, an outer peripheral surface part of the second skirt portion has a first end connected to the lead frame and the first skirt portion, a second end connected to the heatsink, and at least one bent portion formed between the first end and the second end, the second skirt portion has a recessed and projecting portion formed in a recessed and projecting shape at an end of the thin molded portion, the bent portion includes a plurality of bent portions formed at the recessed and projecting portion, and part from the first end through the plurality of bent portions to the second end is a fourteenth joining portion between the first skirt portion and the second skirt portion.

20. The semiconductor device according to claim 19, wherein joining surfaces of the first skirt portion and the second skirt portion are roughened.

* * * * *